United States Patent
Miyakawa et al.

(10) Patent No.: US 7,486,578 B2
(45) Date of Patent: Feb. 3, 2009

(54) TEST METHOD FOR FERROELECTRIC MEMORY

(75) Inventors: Tadashi Miyakawa, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 11/822,244

(22) Filed: Jul. 3, 2007

(65) Prior Publication Data

US 2008/0013361 A1    Jan. 17, 2008

(30) Foreign Application Priority Data

Jul. 4, 2006    (JP)    ............... 2006-184238

(51) Int. Cl.
*G11C 29/00*    (2006.01)
(52) U.S. Cl. ...................... 365/201; 365/145
(58) Field of Classification Search ............... None
See application file for complete search history.

(56) References Cited

U.S. PATENT DOCUMENTS 6,094,370 A * 7/2000 Takashima .................. 365/145
6,151,242 A * 11/2000 Takashima .................. 365/145
6,618,284 B2 * 9/2003 Shimada et al. ............. 365/145

FOREIGN PATENT DOCUMENTS

| JP | 2002-313100 | 10/2002 |
|----|-------------|---------|
| JP | 2005-209324 | 8/2005  |

* cited by examiner

*Primary Examiner*—Tan T. Nguyen
(74) *Attorney, Agent, or Firm*—Finnegan, Henderson, Farabow, Garrett & Dunner, L.L.P.

(57) ABSTRACT

A ferroelectric memory includes a cell block that includes: a block select transistor arranged between a bit line and a local bit line; memory cells arranged between the local bit line and a plate line, each of the memory cells contains a cell transistor and a ferroelectric capacitor connected in series; and a reset transistor arranged between the local bit line and the plate line. A test method for the ferroelectric memory includes: applying a potential that allows the cell transistors to be ON to the word lines; applying a potential that allows the reset transistor to be OFF to the reset line; applying a potential that allows the block select transistor to be ON to the block select line; and applying a stress voltage between the bit line and the plate line.

20 Claims, 17 Drawing Sheets

TEST METHOD FOR FERROELECTRIC MEMORY

CROSS-REFERENCE TO RELATED APPLICATIONS

This application is based upon and claims the benefit of priority from Japanese Patent Application No. 2006-184238, filed on Jul. 4, 2006, the entire contents of which are incorporated herein by reference.

BACKGROUND

1. Technical Field

The present invention relates to a test method for a ferroelectric memory and in particular to a technique for performing a stress test by applying a stress voltage to a component of a ferroelectric memory.

2. Description of Related Art

A ferroelectric random access memory (FeRAM) features nonvolatile property such as a flash memory and a high-speed read/write characteristic such as a DRAM (Dynamic Random Access Memory), which has attracted attention as a nonvolatile memory operating at high speed.

As a ferroelectric memory, JP-A-2005-209324 discloses a semiconductor integrated circuit device that includes a memory cell of a size reduced to some degree and a shared plate line and that is capable of operating at high speed by eliminating a delay caused by serial connection of memory cells.

The semiconductor integrated circuit device includes a plurality of first memory cells each including a cell transistor whose gate terminal is connected to a word line and a ferroelectric capacitor connected at one end to a source terminal of the cell transistor. The drain terminal of the cell transistor of each of the plurality of first memory cells is used as a first local bit line LBL, and the other end of each of the ferroelectric capacitors is used as a first plate line PL. A first reset transistor has a source terminal connected to the first plate line and a drain terminal connected to the first local bit line. A first block select transistor QS has a source terminal connected to the first local bit line and a drain terminal connected to the first bit line.

In a stress test for such a ferroelectric memory, stress is simultaneously applied to a plurality of memory cells so that a plurality of plate lines are driven. However, the stress test time may increase due to a delay of the rise and fall of a signal flowing through the plate line.

SUMMARY

According to a first aspect of the invention, there is provided a test method for a ferroelectric memory including a cell block that includes: a block select transistor arranged between a bit line and a local bit line, which is turned on/off depending on a potential of a block select line; memory cells arranged between the local bit line and a plate line, each of the memory cells contains a cell transistor and a ferroelectric capacitor connected in series, and the cell transistor turned on/off depending on a potential of word lines; and a reset transistor arranged between the local bit line and the plate line, which is turned on/off depending on a potential of a reset line, the method including: applying a potential that allows the cell transistors to be ON to the word lines; applying a potential that allows the reset transistor to be OFF to the reset line; applying a potential that allows the block select transistor to be ON to the block select line; and applying a stress voltage between the bit line and the plate line.

According to a second aspect of the invention, there is provided a test method for a ferroelectric memory including a cell block that includes: a block select transistor arranged between a bit line and a local bit line, which is turned on/off depending on a potential of a block select line; memory cells arranged between the local bit line and a plate line, each of the memory cells contains a cell transistor and a ferroelectric capacitor connected in series, and the cell transistor turned on/off depending on a potential of word lines; and a reset transistor arranged between the local bit line and the plate line, which is turned on/off depending on a potential of a reset line, the method comprising; applying a stress voltage to at least one of: the cell transistors; the reset transistor; and the block select transistor.

According to a third aspect of the invention, there is provided a test method for a ferroelectric memory including a first and second cell blocks, first and second reset lines respectively connected to the first and second cell blocks, first and second block select lines respectively connected to the first and second cell blocks, word lines respectively connected to memory cells contained in the first and second cell blocks, first and second bit lines respectively connected to the first and second cell blocks, and a plate line connected to the first and second cell blocks, wherein each of the first and second cell blocks contains: a block select transistor arranged between the connected bit line and a local bit line, which is turned on/off depending on a potential of the connected block select line; the memory cells arranged between the local bit line and the plate line, each of the memory cells contains a cell transistor and a ferroelectric capacitor connected in series, and the cell transistor turned on/off depending on a potential of the connected word line; and a reset transistor arranged between the local bit line and the plate line, which is turned on/off depending on a potential of the connected reset line, the method comprising: applying a potential that allows the cell transistors to be ON to the word lines; applying a potential that allows the reset transistors to be OFF to the first and second reset lines; applying a potential that allows the block select transistors to be ON to the first and second block select lines; and applying a stress voltage between the first and second bit lines and the plate line.

According to a fourth aspect of the invention, there is provided a test method for a ferroelectric memory including a first and second cell blocks, first and second reset lines respectively connected to the first and second cell blocks, first and second block select lines respectively connected to the first and second cell blocks, word lines respectively connected to memory cells contained in the first and second cell blocks, first and second bit lines respectively connected to the first and second cell blocks, and a plate line connected to the first and second cell blocks, wherein each of the first and second cell blocks contains: a block select transistor arranged between the connected bit line and a local bit line, which is turned on/off depending on a potential of the connected block select line; the memory cells arranged between the local bit line and the plate line, each of the memory cells contains a cell transistor and a ferroelectric capacitor connected in series, and the cell transistor turned on/off depending on a potential of the connected word line; and a reset transistor arranged between the local bit line and the plate line, which is turned on/off depending on a potential of the connected reset line, the method comprising: applying the stress voltage to at least one of: the cell transistors; the reset transistors; and the block select transistors.

DETAILED DESCRIPTION

Embodiments of the invention will be detailed referring to drawings. While the following describes a ferroelectric memory having a ladder structure where four memory cells are connected in parallel, the number of memory cells is not limited to four but an arbitrary number of memory cells may be used.

EXAMPLE 1

Example 1 shows a test method for a ferroelectric memory for conducting a stress test by applying a predetermined voltage to a ferroelectric capacitor of a memory cell.

Figure 1:
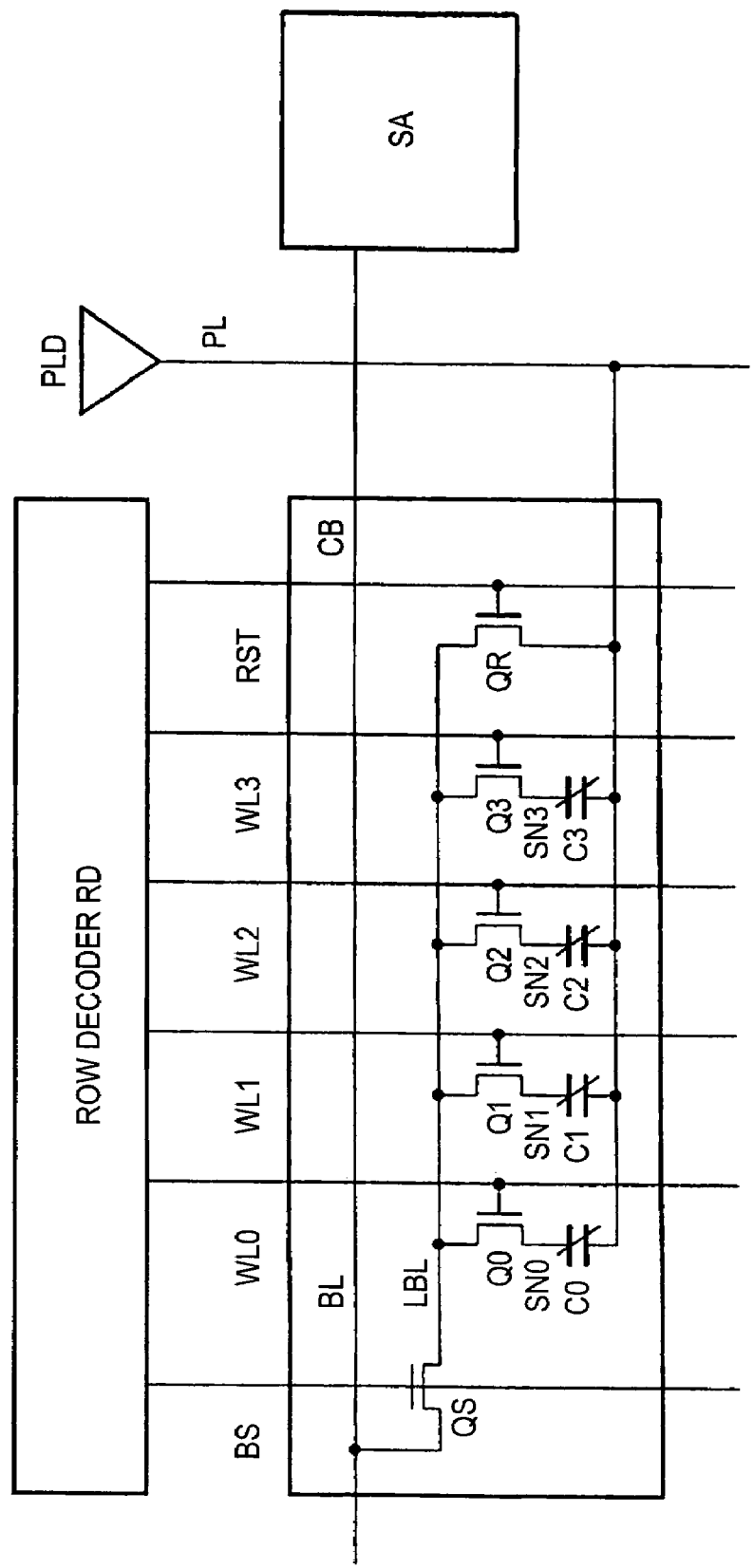
FIG. 1 shows a partial view of a circuit configuration of a ferroelectric memory as a target of a test method for a ferroelectric memory according to Example 1 of the invention.

FIG. 1 is a partial view of a circuit configuration of a ferroelectric memory as a target of a test method for a ferroelectric memory (FeRAM) according to Example 1 of the invention. This ferroelectric memory includes a row decoder RD, a plate line driver PLD, a bit line driving circuit SA and a cell block CB. In FIG. 1, only one cell block CB is shown for clarity.

The row decoder RD controls the potential of each of the word lines WL0-WL3, a reset line RST and a block select line BS connected to the row decoder RD. The plate line driver PLD drives the plate line PL connected to the plate line driver. The bit line driving circuit SA includes a sense amplifier and drives a bit line BL connected to the bit line driving circuit SA as well as detects a signal outputted to the bit line BL.

The cell block CB includes four memory cells where cell transistors Q0-Q3 and ferroelectric capacitors C0-C3 are respectively connected in series. The memory cells are connected in parallel to form a ladder structure. One end of each cell is connected to the plate line PL and the other end is connected to the local bit line LBL. The gates of the cell transistors Q0-Q3 are respectively connected to the word lines WL0-WL3.

A reset transistor QR is arranged between the plate line PL and the local bit line LBL. The gate of the reset transistor QR is connected to the reset line RST. A block select transistor QS is connected between the local bit line LBL and the bit line BL, and the gate of the block select transistor QS is connected to a block select line BS.

Operation of the ferroelectric memory thus configured will be described. In the standby mode, the reset transistor QR in the cell block CB is turned on by the potential outputted from the row decoder RD to the reset line RST. The block select transistor QS is turned off by the potential outputted from the row decoder RD to the block select line BS. Thus, the potential of the local bit line LBL in the cell block CB is equal to that of the plate line PL.

The cell transistors Q0-Q3 in the cell block CB are turned on by the potential outputted from the row decoder RD to the word lines WL0-WL3. The potential of the plate line PL is transferred to cell nodes SN0-SN3. As a result, the potential of the local bit line LBL in the cell block CB is equal to that of the plate line PL.

Thus, the potential across the ferroelectric capacitors C0-C3 of all memory cells in the cell block CB is equal to that of the plate line PL. As a result, no voltage is applied to the ferroelectric capacitors C0-C3 in the standby mode.

In the active mode, the reset transistor QR in the cell block CB are turned off by the potential outputted from the row decoder RD to the reset line RST. Cell transistors of unselected cells such as cell transistors Q0, Q2 and Q3 are turned off by the potential outputted from the row decoder RD to the word lines WL0, WL2 and WL3. The block select transistor QS is turned on by the potential outputted from the row decoder RD to the block select line BS. In this state, the plate line PL is driven.

As a result, only the cell transistor Q1 of a selected cell is ON. The potential of the plate line PL is applied to one end of the ferroelectric capacitor C1 of a selected cell, and the potential of the bit line BL is applied to the other end. Thus, a voltage is applied across the ferroelectric capacitor C1. With the applied voltage, cell information is read from the ferroelectric capacitor C1. The cell information is read out to the bit line BL via the local bit line LBL, amplified by a sense amplifier included in the bit line driving circuit SA, and outputted to the exterior.

In case the read cell information is "0" data, the data is written back to the ferroelectric capacitor C1 with the potential of the plate line PL maintained High. In case the information is "1" data, the potential of the plate line PL is driven Low and is written back. Then the block select transistor QS is turned off and the reset transistor QR and the cell transistors Q0-Q3 are turned on to allow the system to enter the standby mode.

During a stress test for a ferroelectric memory, the reset transistor QR in the cell block CB is turned off by the potential outputted from the row decoder RD to the reset line RST. The cell transistors Q0-Q3 are turned on by the potential outputted from the row decoder RD to the word lines WL0-WL3.

The block select transistor QS is turned on by the potential outputted from the row decoder RD to the block select line BS. In this state, the plate line PL is driven. A stress voltage is applied across the bit line BL and the plate line PL. Since the cell transistors Q0-Q3 of all memory cells are turned on, the potential of the bit line BL is applied to one end of each of all ferroelectric capacitors C0-C3 via the local bit line LBL, and the potential of the plate line PL is applied to the other end.

Figure 2:
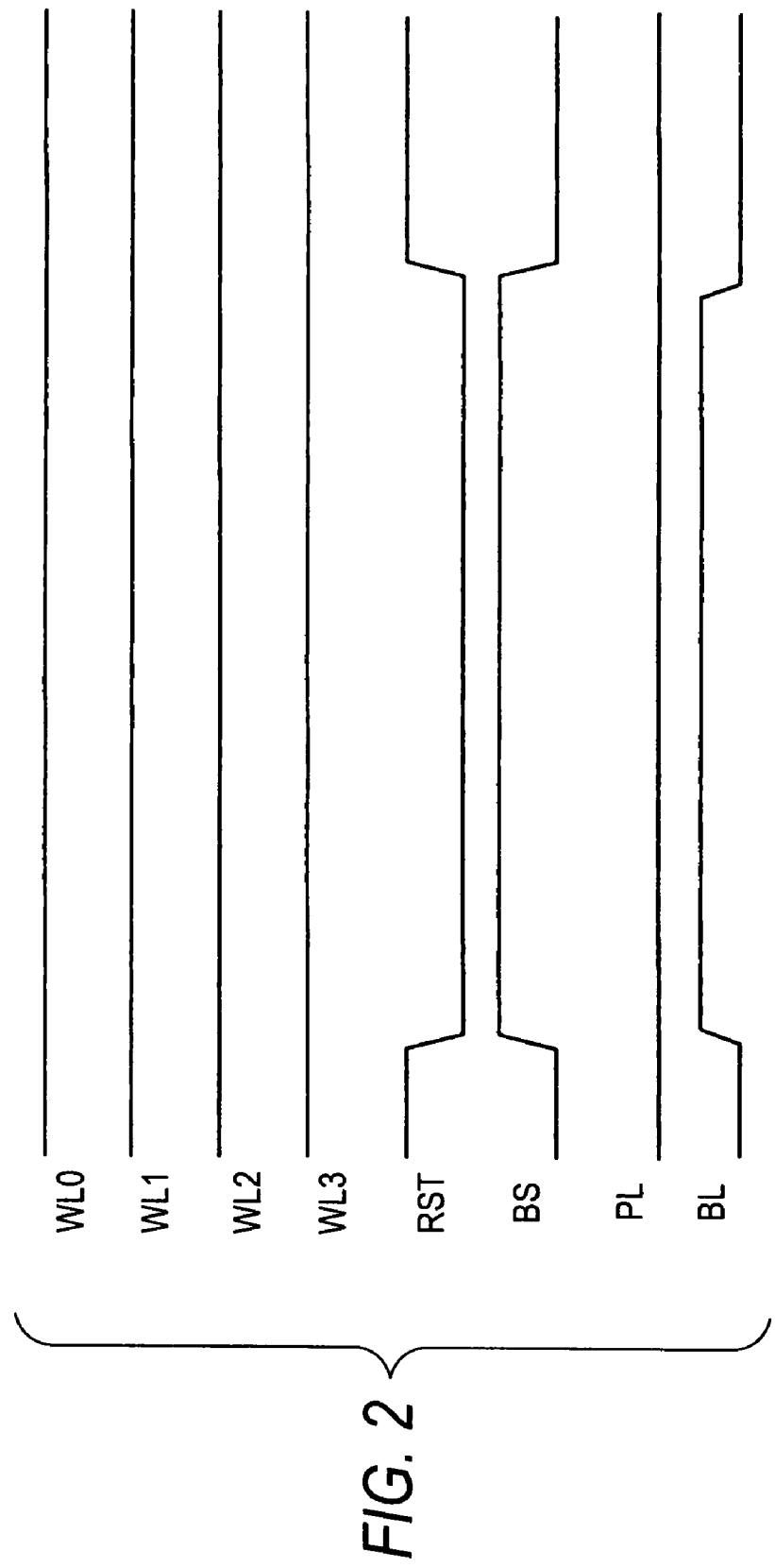
FIG. 2 shows an operation waveform observed during a stress test in accordance with a test method for a ferroelectric memory of Example 1.

FIG. 2 shows an operation waveform observed during a stress test in accordance with the test method for a ferroelectric memory of Example 1. Word lines WL0-WL3 are maintained High, same as in the standby mode. A reset line RST is driven Low while a block select line BS is driven High. A plate line PL is held at a ground level (hereinafter referred to as a "GND" level) and a stress potential is applied to a bit line BL. As a result, a stress voltage Vst is applied to all ferroelectric capacitors C0-C3.

To raise a stress potential applied to the bit line BL, it is necessary to apply a voltage of at least a threshold value higher than the stress voltage Vst to the block select line BS controlling the block select transistor QS and the word lines WL1-WL3 controlling the cell transistors Q0-Q3.

By setting the above stress test conditions to give a predetermined potential to each of the bit line and the plate line, and conducting a test such as a burn-in test at high temperature, it is possible to simultaneously conduct a stress test on all ferroelectric capacitors C0-C3.

EXAMPLE 2

Example 2 shows a test method for a ferroelectric memory for conducting a stress test by applying a predetermined voltage to a ferroelectric capacitor of a memory cell. The circuit configuration of a ferroelectric memory used in the test method for a ferroelectric memory and the operations in the standby mode and active mode according to Example 2 are similar to those in Example 1.

During a stress test for a ferroelectric memory, the reset transistor QR in the cell block CB is turned off by the potential outputted from the row decoder RD to the reset line RST. The cell transistors Q0-Q3 are turned on by the potential outputted from the row decoder RD to the word lines WL0-WL3.

The block select transistor QS is turned on by the potential outputted from the row decoder RD to the block select line BS. A stress voltage is applied across the bit line BL and the plate line PL. Since the cell transistors Q0-Q3 of all memory cells are turned on, the potential of the bit line BL is applied to one end of each of all ferroelectric capacitors C0-C3 via the local bit line LBL, and the potential of the plate line PL is applied to the other end.

Figure 3:
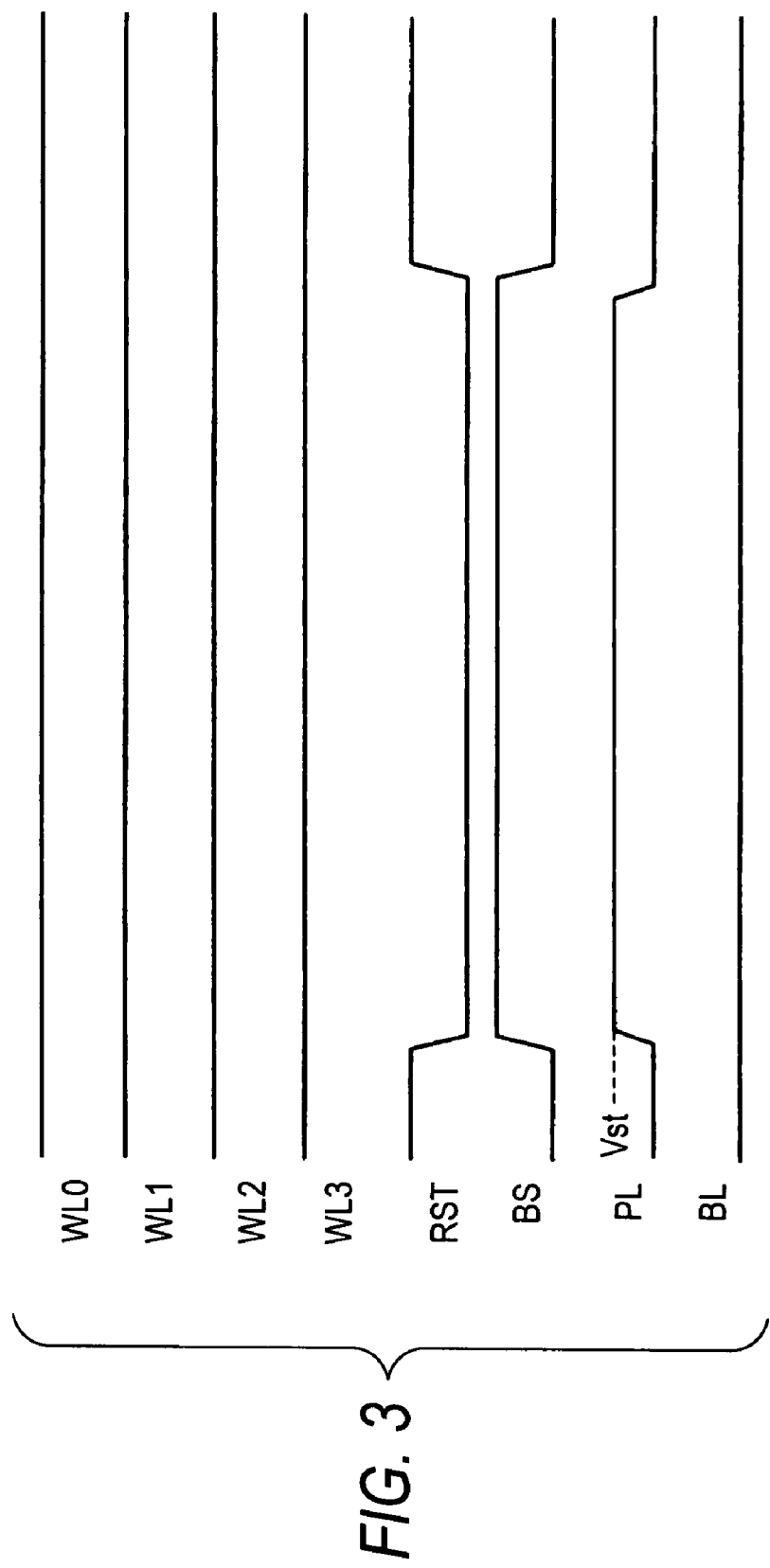
FIG. 3 shows an operation waveform observed during a stress test in accordance with a test method for a ferroelectric memory of Example 2.

FIG. 3 shows an operation waveform observed during a stress test in accordance with a test method for a ferroelectric memory of Example 2. Word lines WL0-WL3 are maintained High, same as in the standby mode. A reset line RST is driven Low while a block select line BS is driven High. A stress potential is applied to a plate line PL, and a bit line BL is held at a GND level. As a result, a stress voltage Vst is applied to all ferroelectric capacitors C0-C3. In the stress test, an electric field is applied to the ferroelectric capacitors C0-C3 in the direction from the plate line PL to cell nodes SN0-SN3.

By setting the above stress test conditions to give a predetermined potential to each of the bit line and the plate line, and conducting a test such as a burn-in test at high temperature, it is possible to simultaneously conduct a stress test on all ferroelectric capacitors C0-C3.

EXAMPLE 3

Example 3 shows a test method for a ferroelectric memory for conducting a stress test related to a fatigue test that repeats polarization inversion of a ferroelectric capacitor of a memory cell. The circuit configuration of a ferroelectric memory used in the test method for a ferroelectric memory and the operations in the standby mode and active mode according to Example 3 are similar to those in Example 1.

Figure 4:
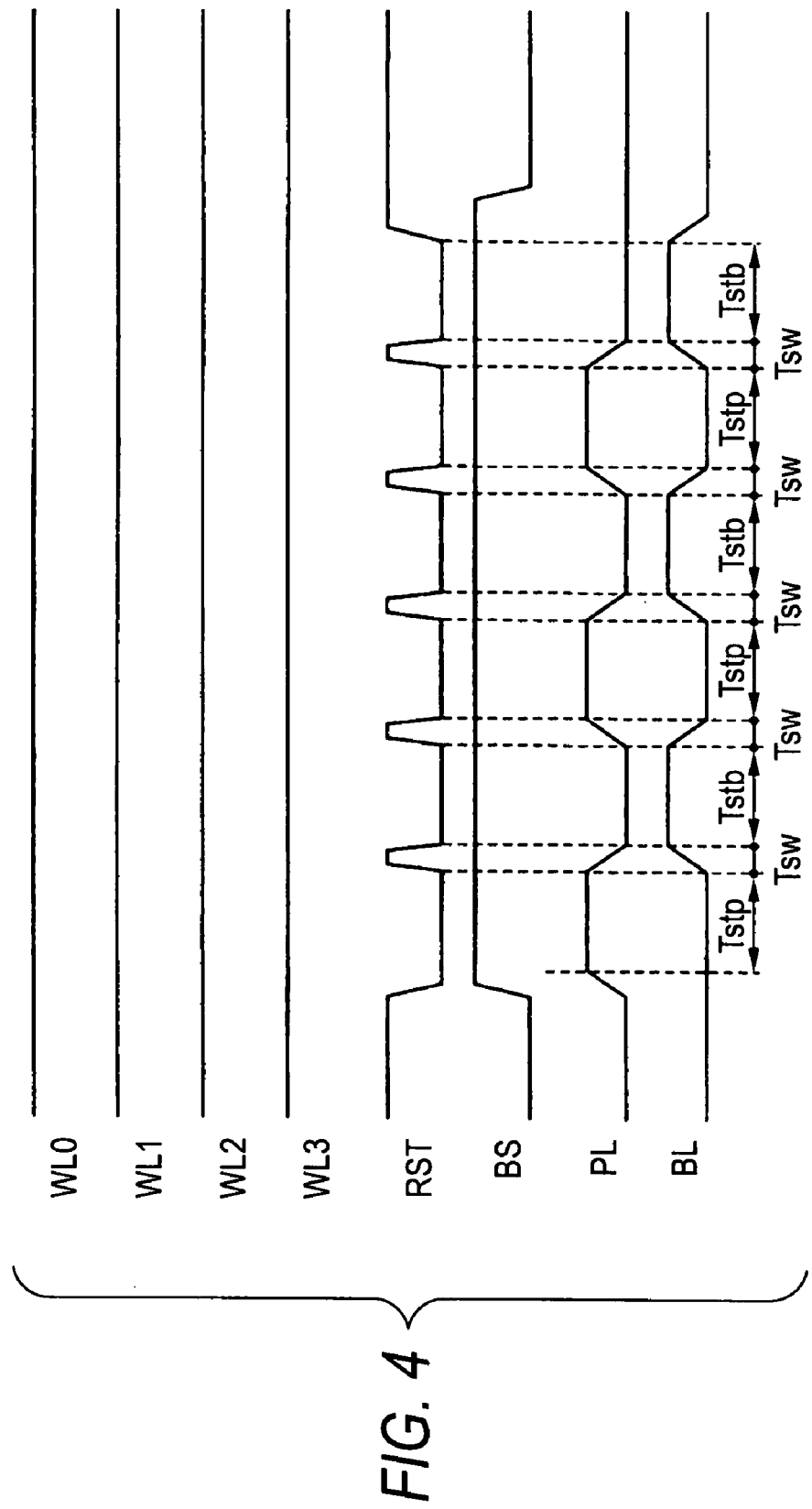
FIG. 4 shows an operation waveform observed during a stress test in accordance with a test method for a ferroelectric memory of Example 3.

FIG. 4 shows an operation waveform observed during a stress test in accordance with a test method for a ferroelectric memory of Example 3. Word lines WL0-WL3 are maintained High, same as in the standby mode. A reset line RST is driven Low in a period Tstp and in a period Tstb. In the period Tstp, a stress potential is applied to a plate line PL. In a period Tstb, a stress potential is applied to a bit line BL. The reset line RST is driven High in a period Tsw where a polarity of the stress voltage Vst is switched. A block select line BS is driven High. A high level potential and a low level potential are alternately applied to the plate line PL and the bit line BL in a predetermined cycle.

The period Tstp and the period Tstb shown in FIG. 4 are periods where a stress voltage Vst is applied to the ferroelectric capacitors C0-C3 and the reset line RST is driven Low. The period Tsw is a period where the stress voltage is inverted and the reset line RST is driven High. In the period Tstp, the plate line PL is held at a stress potential and the bit line BL is held at a GND level. In the period Tstb, the plate line PL is held at a GND level and the bit line EL is held at a stress potential.

In the period Tstp, an electric field is applied to the ferroelectric capacitors C0-C3 in the direction from the plate line PL to cell nodes SN0-SN3. In the period Tstb, an electric field is applied to the ferroelectric capacitors C0-C3 in the direction from the cell nodes SN0-SN3 to the plate line PL. In the period Tsw, the signal at the reset line RST is High. The plate line PL and the local bit line LBL are short-circuited and the cell transistors Q0-Q3 are ON, so that the cell nodes SN0-SN3 and the plate line PL are short-circuited.

When transition is made from the period Tstp to the period Tsw, the potential of the plate line PL is discharged not only by a plate driving circuit PLD but also from a bit line driving circuit SA via a reset transistor QR, a local bit line LBL, a block select transistor QS and a bit line BL.

When transition is made from the period Tstb to the period Tsw, the potential of the cell nodes SN0-SN3 is discharged not only from a bit line driving circuit SA via cell transistors Q0-Q3, a local bit line LBL, a block select transistor QS and a bit line BL but also from a plate driving circuit PLD from a local bit line LBL via a reset transistor QR. Thus, when the polarity of a voltage is switched, high-speed discharge is enabled so that it is possible to conduct a fatigue test of high-speed voltage switching on the ferroelectric capacitors C0-C3.

Figure 5A:
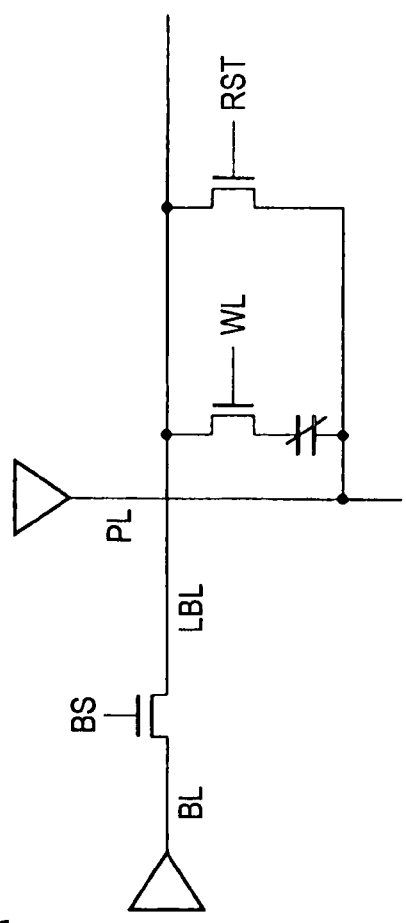
FIGS. 5A and 5B show a detailed waveform of a voltage applied to a ferroelectric capacitor during a stress test in accordance with a test method for a ferroelectric memory of Example 3.
Figure 5B:
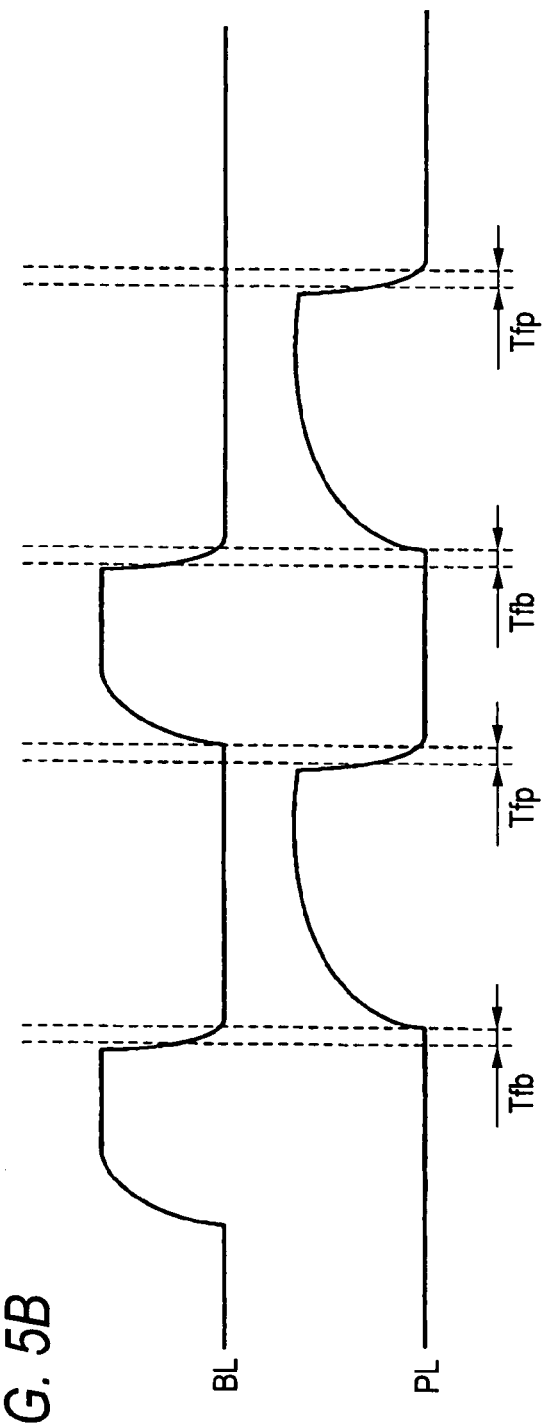

FIGS. 5A and 5B show a detailed waveform of the voltage applied to the ferroelectric capacitors C0-C3 via the bit line BL and the plate line PL. As shown in FIGS. 5A and 5B, a memory cell of a general ferroelectric memory provides high-speed fall of a voltage at the plate line PL as well as high speed fall of a voltage at the bit line BL. By short-circuiting the plate line PL and the local bit line LBL with a timing of switching a voltage applied across the ferroelectric capacitors C0 to C3, both ends of each of the C0-C3 are short-circuited and is equalized, thus accelerating high-level discharging and low-level charging.

By setting the above stress test conditions to give a predetermined potential to each of the bit line and the plate line, and conducting a test such as a burn-in test at high temperature, it is possible to simultaneously conduct a stress test on all ferroelectric capacitors C0-C3.

EXAMPLE 4

Example 5 shows a test method for a ferroelectric memory according for conducting a stress test by applying a predetermined voltage to cell transistors Q0-Q3 of a memory cell. The circuit configuration of a ferroelectric memory used in the test method for a ferroelectric memory and the operations in the standby mode and active mode according to Example 4 are similar to those in Example 1.

Figure 6:
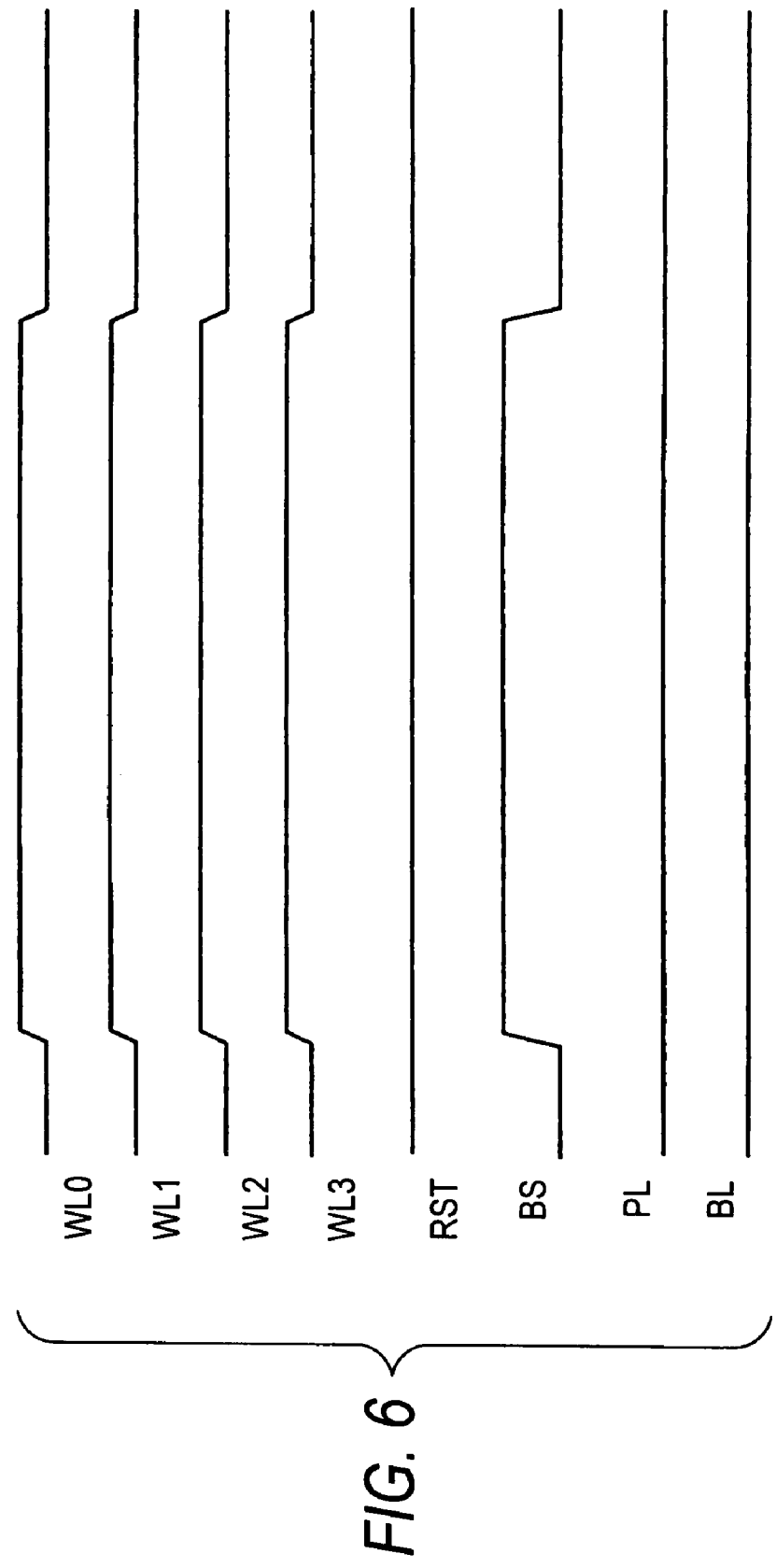
FIG. 6 shows an operation waveform observed during a stress test in accordance with a test method for a ferroelectric memory of Example 4.

FIG. 6 shows an operation waveform observed during a stress test in accordance with a test method for a ferroelectric memory of Example 4. A voltage equal to or higher than the voltage used in the standby mode by a predetermined voltage level is applied to word lines WL0-WL3. A reset line RST is driven High. A block select line BS is driven High and a plate line PL and a bit line BL are held at a GND level.

As a result, a stress voltage Vst is applied to all cell transistors Q0-Q3. In the stress test, a stress voltage is applied to the channel region between the source and the drain from the gate of each of the cell transistors Q0-Q3.

By setting the above stress test conditions and conducting a test such as a burn-in test at high temperature it is possible to simultaneously conduct a stress test on all cell transistors Q0-Q3.

EXAMPLE 5

Example 5 shows a test method for a ferroelectric memory for conducting a stress test by applying a predetermined voltage to a reset transistor QR. The circuit configuration of a ferroelectric memory used in the test method for a ferroelectric memory and the operations in the standby mode and active mode according to Example 5 are similar to those in Example 1.

Figure 7:
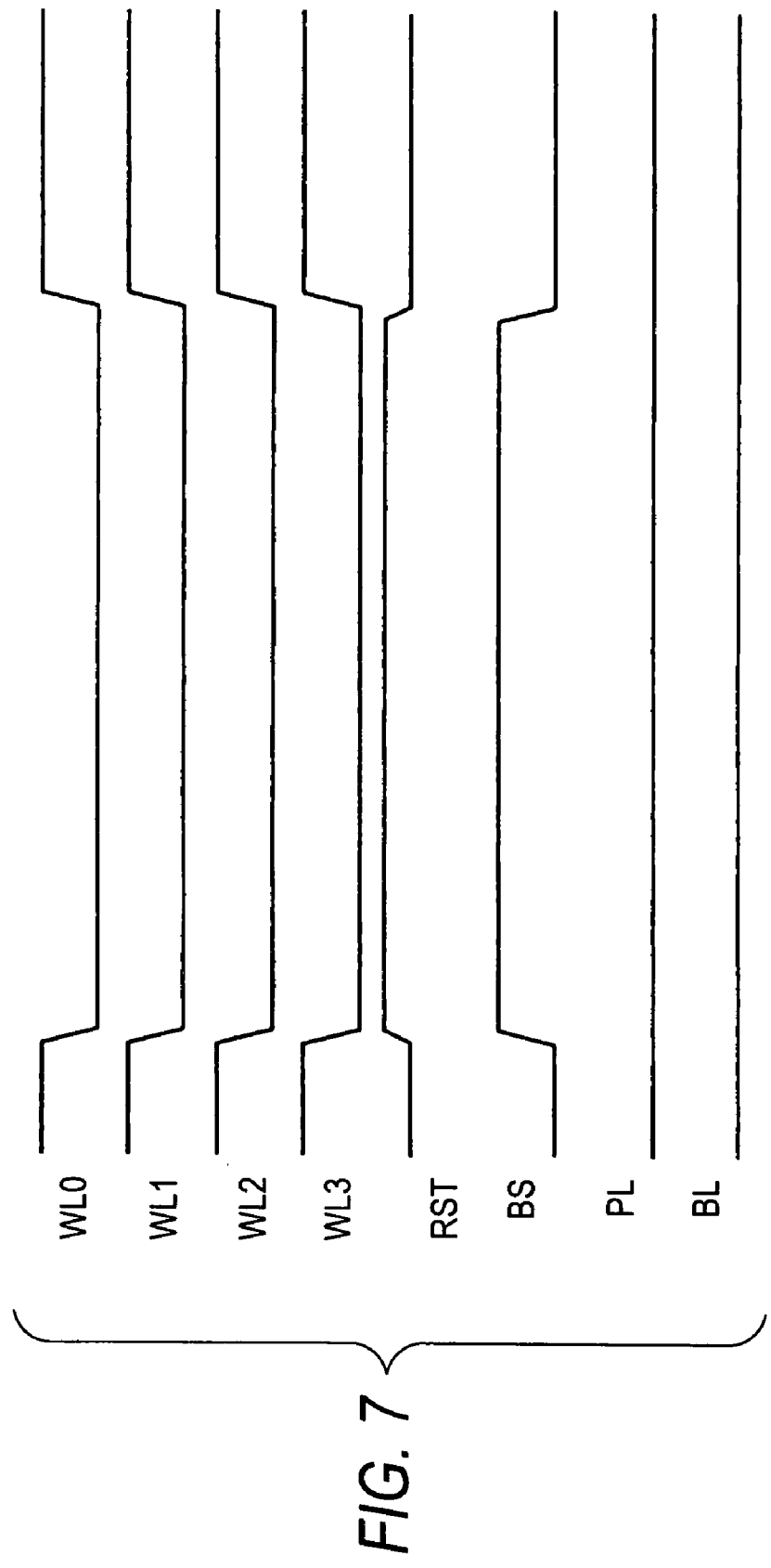
FIG. 7 shows an operation waveform observed during a stress test in accordance with a test method for a ferroelectric memory of Example 5.

FIG. 7 shows an operation waveform observed during a stress test in accordance with a test method for a ferroelectric memory of Example 5. Word lines WL0-WL3 are driven Low. A voltage higher than the voltage used in the standby mode by a predetermined voltage is applied to a reset line RST. A block select line BS is driven High and a plate line PL and a bit line BL are held at a GND level.

As a result, a stress voltage Vst is applied to the reset transistor QR. In the stress test, the stress voltage is applied to the channel region between the source and the drain from the gate of the reset transistor QR.

By setting the above stress test conditions and conducting a test such as a burn-in test at high temperature, it is possible to conduct a stress test on the reset transistor QR.

EXAMPLE 6

Example 6 shows a test method for a ferroelectric memory for conducting a stress test by applying a predetermined voltage to a block select transistor QS. The circuit configuration of a ferroelectric memory used in the test method for a ferroelectric memory and the operations in the standby mode and active mode according to Example 6 are similar to those in Example 1.

Figure 8:
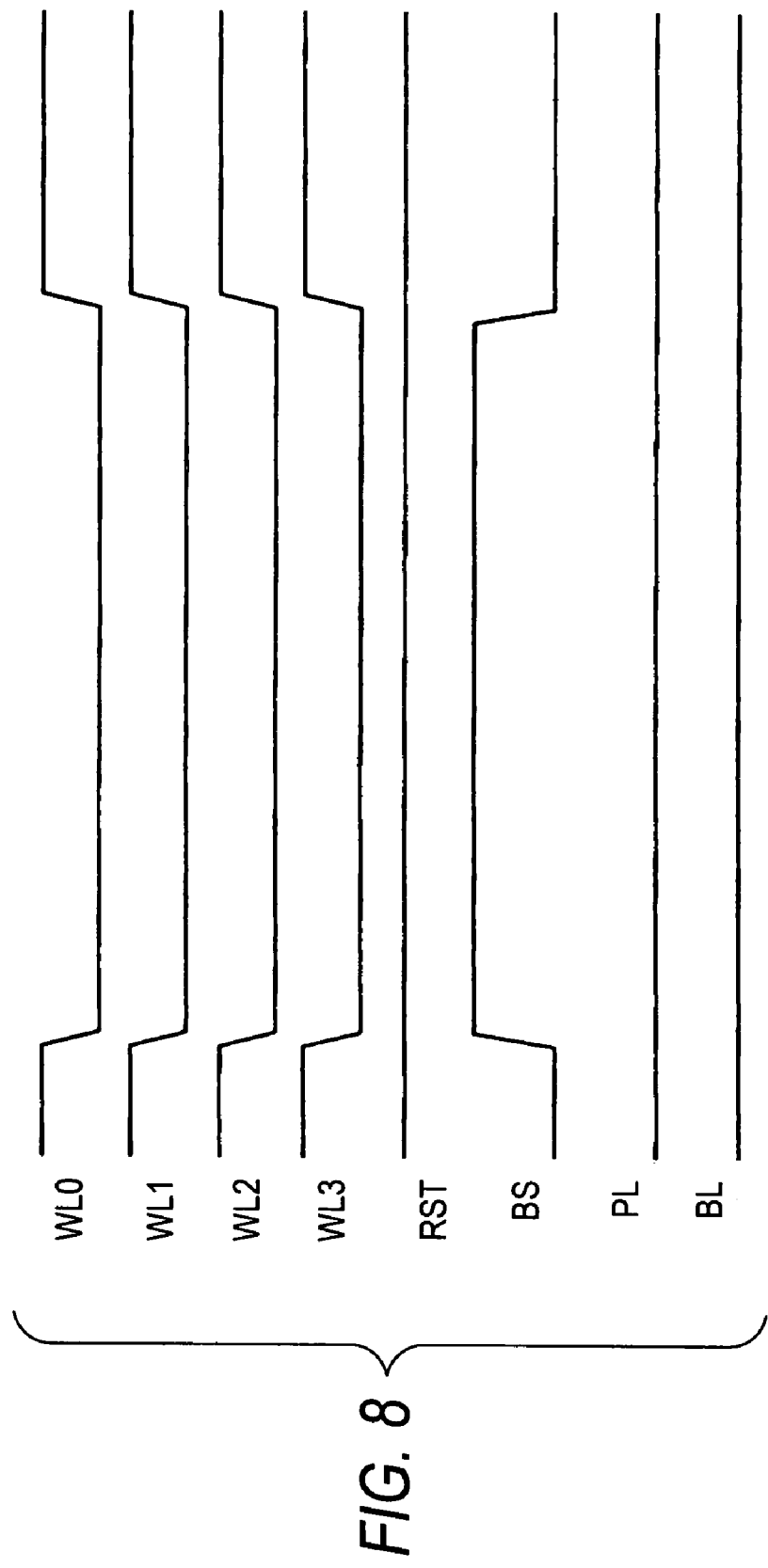
FIG. 8 shows an operation waveform observed during a stress test in accordance with a test method for a ferroelectric memory of Example 6.

FIG. 8 shows an operation waveform observed during a stress test in accordance with a test method for a ferroelectric memory of Example 6. Word lines WL0-WL3 are driven Low. A high level voltage is applied to a reset line RST. A block select line BS is held at a stress voltage. A GND level voltage is applied to a plate line PL and a bit line BL. As a result, a stress voltage Vst is applied to a block select transistor QS. In the stress test, a stress voltage is applied to the channel region between the source and the drain from the gate of the block select transistor QS.

By setting the above stress test conditions and conducting a test such as a burn-in test at high temperature, it is possible to conduct a stress test on the block select transistor QS.

EXAMPLE 7

Example 7 shows a test method for a ferroelectric memory for conducting a stress test by simultaneously applying a predetermined voltage to cell transistors Q0-Q3, a reset transistor QR and a block select transistor QS. The circuit configuration of a ferroelectric memory used in the test method for a ferroelectric memory and the operations in the standby mode and active mode according to Example 7 are similar to those in Example 1.

Figure 9:
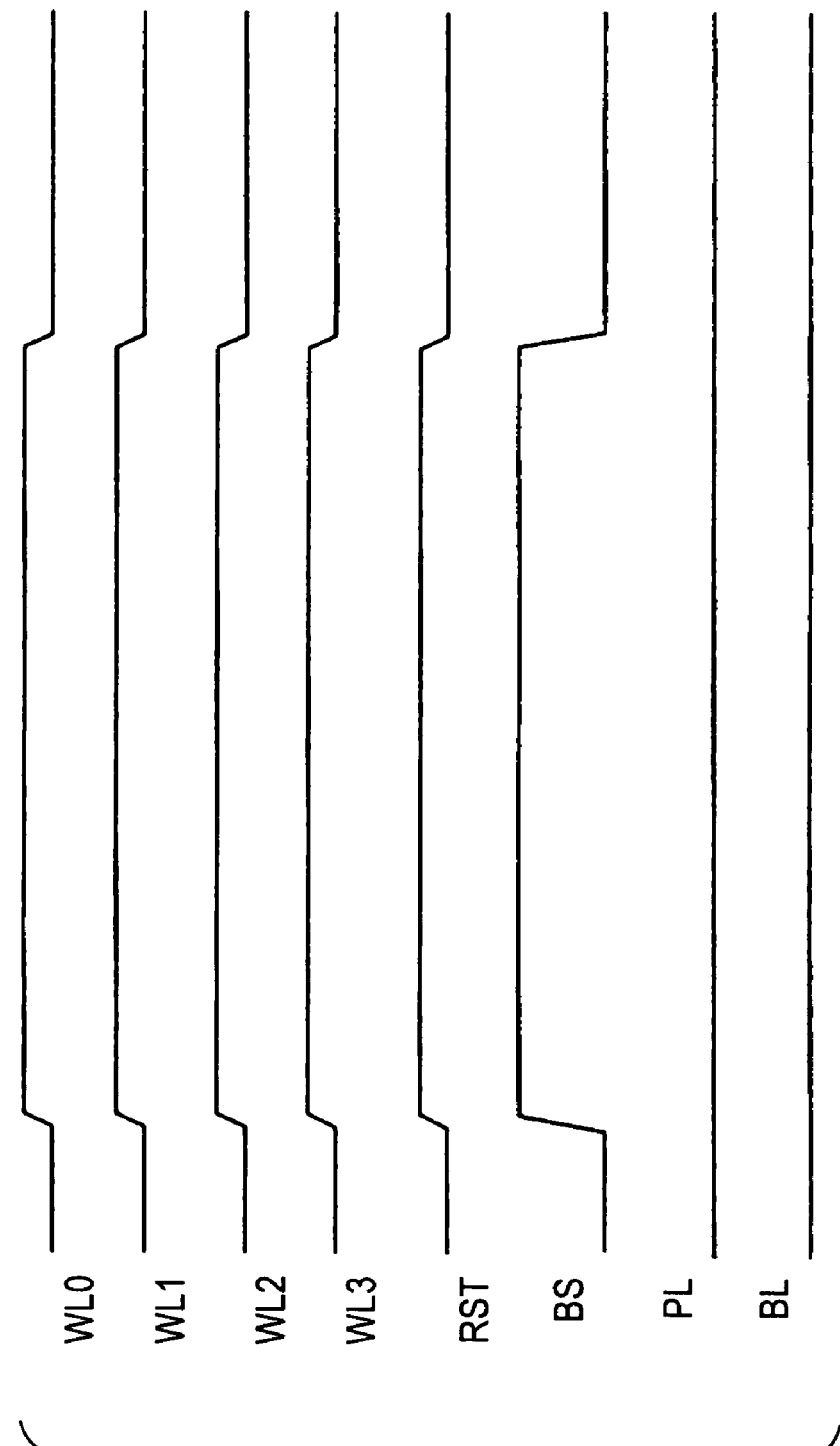
FIG. 9 shows an operation waveform observed during a stress test in accordance with a test method for a ferroelectric memory of Example 7.

FIG. 9 shows an operation waveform observed during a stress test in accordance with a test method for a ferroelectric memory of Example 7. A voltage higher than the voltage used in the standby mode by a predetermined voltage is applied to word lines WL0-WL3. A voltage higher than the voltage used in the standby mode by a predetermined voltage is applied to a reset line RST. A block select line BS is driven by the voltage higher than the voltage used in the active mode. A plate line PL and a bit line BL are held at a GND level. As a result, a stress voltage Vst is applied to all cell transistors Q0-Q3, reset transistor QR and block select transistor QS. In the stress test, a stress voltage is applied to the channel region between the source and the drain from the gate of each transistor.

By setting the above stress test conditions and conducting a test such as a burn-in test at high temperature, it is possible to simultaneously conduct a stress test on all cell transistors Q0-Q3, reset transistor QR and block select transistor QS.

EXAMPLE 8

Example 8 shows a test method for a ferroelectric memory according for conducting a stress test by simultaneously applying a predetermined voltage to ferroelectric capacitors of a ferroelectric memory in two cell blocks.

Figure 10:
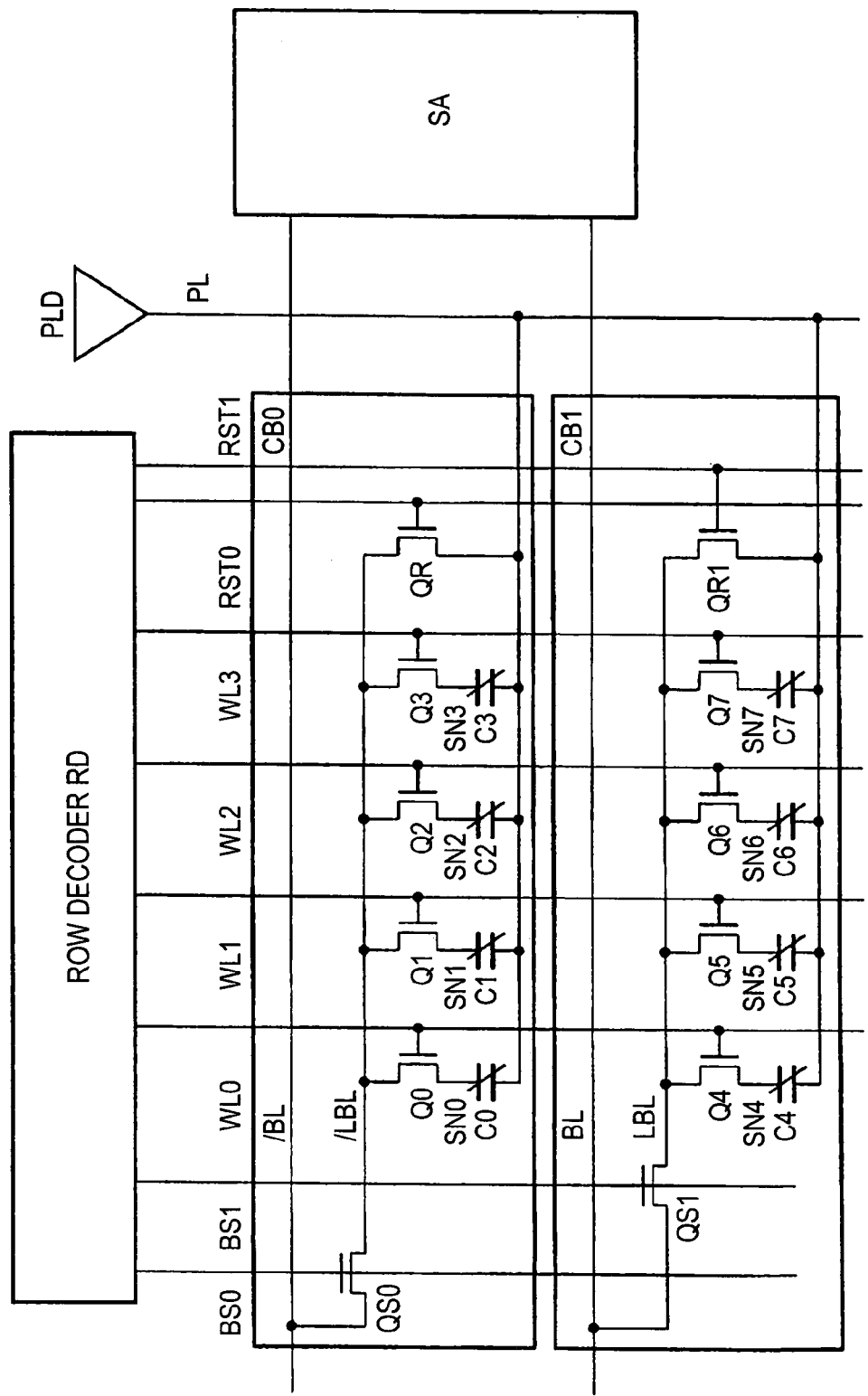
FIG. 10 shows a partial view of a circuit configuration of a ferroelectric memory as a target of a test method for a ferroelectric memory according to Example 8.

FIG. 10 is a partial view of the circuit configuration of a ferroelectric memory as a target of the test method for a ferroelectric memory according to Example 8 of the invention. This ferroelectric memory is includes a row decoder RD, a plate line driver PLD, a bit line driving circuit SA, a first cell block CB0 and a second cell block CB1.

The first cell block CB0 and the second cell block CB1 have the similar configuration to that of the cell block CB shown in FIG. 1 and are provided in correspondence to a first bit line/BL and a second bit line/BL (bit line pair) respectively. The first bit line/BL and the second bit line BL are connected to a bit line driving circuit SA. The first cell block CB0 and the second cell block CB1 share a plate line PL.

The row decoder RD controls the potential of each of the word lines WL0-WL3, a first reset line RST0, a second reset line RST1, a first block select line BS0 and a second block select line BS1 connected to the row decoder RD. The plate line driver PLD drives the plate line PL connected to the plate line driver. The bit line driving circuit SA includes a sense amplifier and drives the first bit line/BL and the second bit line BL connected to the bit line driving circuit SA as well as detects a signal outputted to the first bit line/BL and the second bit line BL.

The first cell block CB0 includes first cell transistors Q0-Q3, first ferroelectric capacitors C0-C3, a first reset transistor QR0, a first block select transistor QS0 and a first local bit line/LBL. The first cell block CB0 includes four memory cells where the first cell transistors Q0-Q3 and the first ferroelectric capacitors C0-C3 are respectively connected in series. The memory cells are connected in parallel to form a ladder structure. One end of each cell is connected to the plate line PL and the other end is connected to the first local bit line/LBL. The gates of the first cell transistors Q0-Q3 are respectively connected to the word lines WL0-WL3.

The first reset transistor QR0 is arranged between the plate line PL and the first local bit line/LBL. The gate of the first reset transistor QR0 is connected to the first reset line RST0. The first block select transistor QS0 is connected between the first local bit line/LBL and the first bit line/BL, and the gate of the first block select transistor QS0 is connected to a first block select line BS0.

The second cell block CB1 includes second cell transistors Q4-Q7, second ferroelectric capacitors C4-C7, a second reset transistor QR1, a second block select transistor QS1 and a second local bit line LBL. The second cell block CB1 includes four memory cells where the second cell transistors Q4-Q7 and the second ferroelectric capacitors C4-C7 are respectively connected in series. The memory cells are connected in parallel to form a ladder structure. One end of each cell is connected to the plate line PL and the other end is connected to the second local bit line LBL. The gates of the second cell transistors Q4-Q7 are respectively connected to the word lines WL0-WL3.

The second reset transistor QR1 is arranged between the plate line PL and the second local bit line LBL. The gate of the second reset transistor QR1 is connected to the second reset line RST1. The second block select transistor QS1 is connected between the second local bit line LBL and the second bit line BL, and the gate of the second block select transistor QS1 is connected to a second block select line BS1.

Next, operation of the ferroelectric memory shown in FIG. 10 will be described. Operation of each of the first cell block CB0 and the second cell block CB1 is similar to that of the cell block CB according to Example 1. In case information is read from a memory cell in the first cell block CB0, the first block select transistor QS0 is turned on and the second block select transistor QS1 is turned off. In this state, the plate line PL is driven.

As a result, cell information is read to the first bit line/BL. The potential of the second bit line BL is used as a reference potential in the bit driving circuit SA. The potential of the first bit line/BL and the potential of the second bit line BL are amplified by a sense amplifier in the bit line driving circuit SA. In case information is read from a memory cell in the second cell block CB1, the similar procedure is used.

The ferroelectric memory described above is capable of decreasing the area of a sense amplifier of the bit line driving circuit SA and reducing noise from a memory cell array.

During a stress test for a ferroelectric memory, the cell transistors Q0-Q7 in the first cell block CB0 and the second cell block CB1 are turned on. The first reset transistor QR0 and the second reset transistor QR1 are turned off. The first block select transistor QS0 and the second block select transistor QS1 are turned on. In this state, a predetermined voltage is applied across the first bit line/BL and the plate line PL, and across the second bit line BL and the plate line PL.

Since the cell transistors Q0-Q7 of all memory cells are turned on, the potential of the first bit line/BL and the potential of the second bit line BL are respectively applied to one end of all ferroelectric capacitors C0-C7 via the first local bit line/LBL and the second local bit line LBL, and the potential of the plate line PL is applied to the other end.

Figure 11:
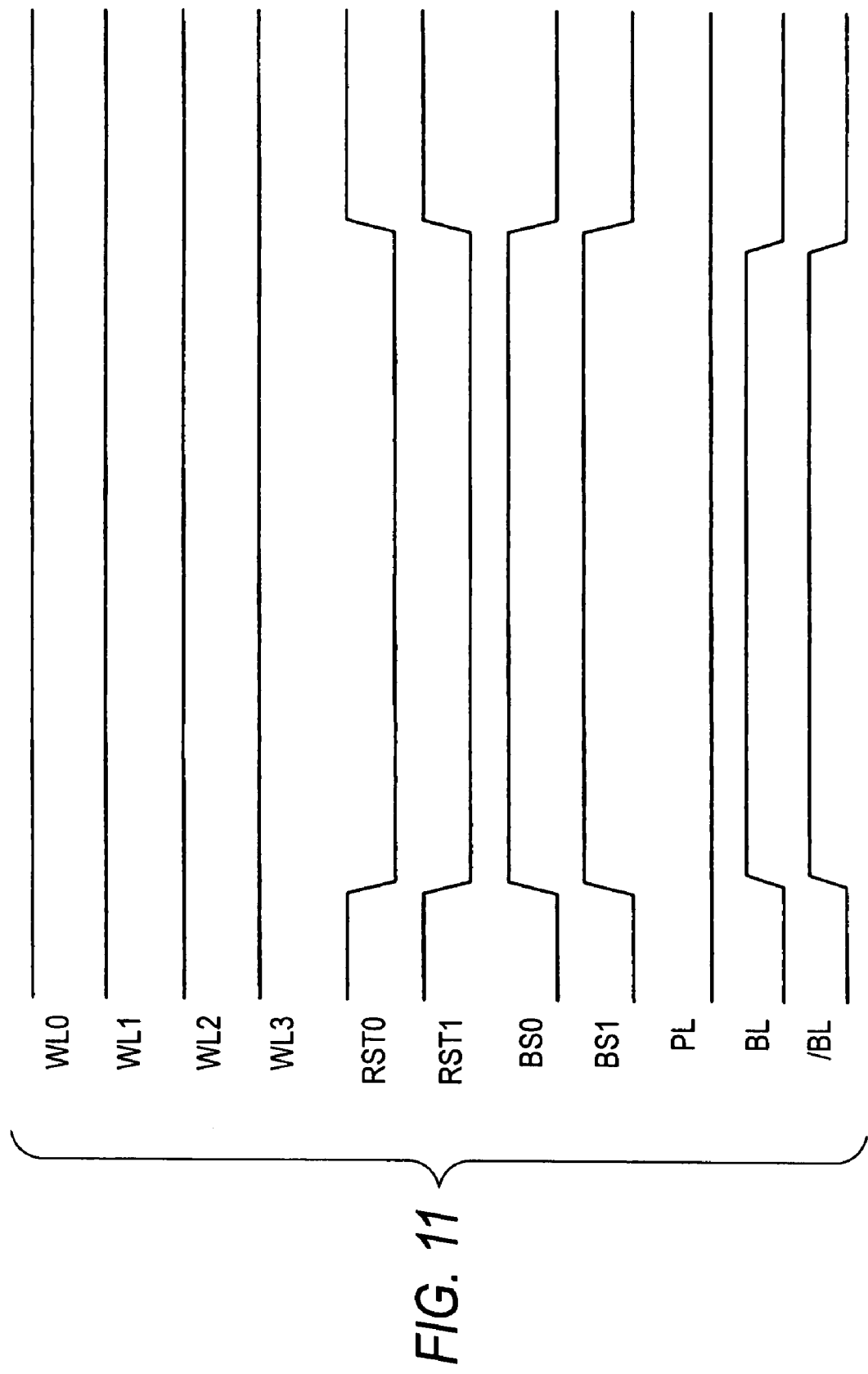
FIG. 11 shows an operation waveform observed during a stress test in accordance with a test method for a ferroelectric memory of Example 8.

FIG. 11 shows an operation waveform observed during a stress test in accordance with a test method for a ferroelectric memory of Example 8. Word lines WL0-WL3 are maintained High, sane as in the standby mode. A first reset line RST0 and a second reset line RST1 are driven Low. A first block select line BS0 and a second first block select line BS1 are driven High. A plate line PL is held at a GND level. A stress potential is applied to a first bit line/BL and a second bit line BL. As a result, a stress voltage Vst is applied to all ferroelectric capacitors C0-C7.

To raise the potential of the stress voltage Vst applied to the first bit line/BL and the second bit line BL, it is necessary to apply a voltage higher than the stress voltage Vst by at least a threshold value to the first block select line BS0 and the second block select line BS1 controlling the first block select transistor QS0 and the second block select transistor QS1 and the word lines WL0-WL3 controlling the first and second cell transistors Q0-Q7.

By setting the above stress test conditions to provide a predetermined potential to each of the first bit line/BL and the second bit line BL as well as the plate line PL, and conducting a test such as a burn-in test at high temperature, it is possible to simultaneously conduct a stress test on all ferroelectric capacitors C0-C7.

EXAMPLE 9

Example 9 shows a test method for a ferroelectric memory for conducting a stress test by applying a predetermined voltage to a ferroelectric capacitor of a memory cell. The circuit configuration of a ferroelectric memory used in the test method for a ferroelectric memory and the operations in the standby mode and active mode according to Example 9 are similar to those in Example 8.

During a stress test for a ferroelectric memory, the cell transistors Q0-Q7 in the first cell block CB0 and the second cell block CB1 are turned on. The first reset transistor QR0 and the second reset transistor QR1 are turned off. The first block select transistor QS0 and the second block select transistor QS1 are turned on. A predetermined voltage is applied across the first bit line/BL, the second bit line BL and the plate line PL. As a result, since the cell transistors Q0-Q7 of all memory cells are turned on, the potential of the first bit line/BL and the potential of the second bit line BL are respectively applied to one end of all ferroelectric capacitors C0-C7 via the first local bit line/LBL and the second local bit line LBL, and the potential of the plate line PL is applied to the other end.

Figure 12:
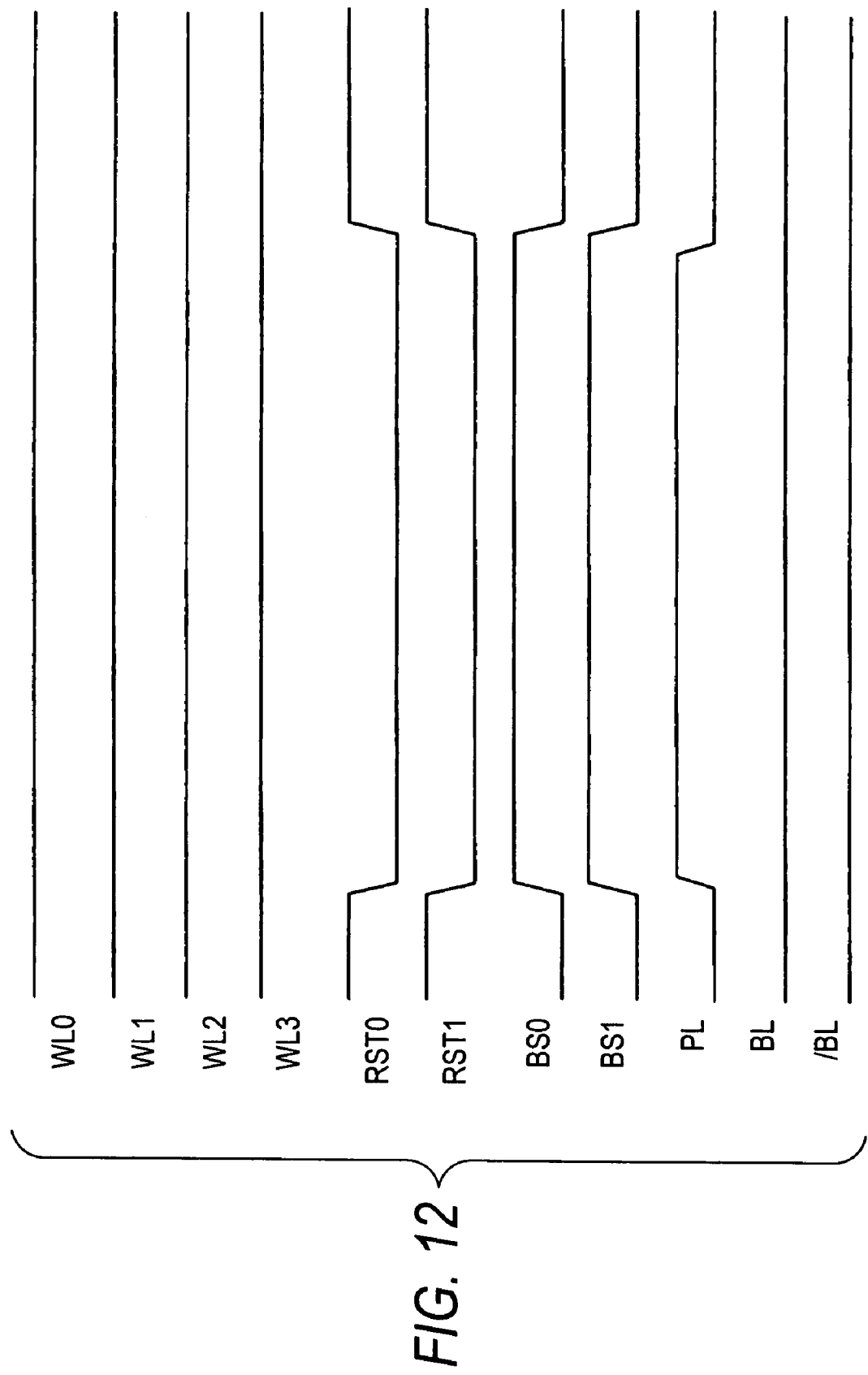
FIG. 12 shows an operation waveform observed during a stress test in accordance with a test method for a ferroelectric memory of Example 9.

FIG. 12 shows an operation waveform observed during a stress test in accordance with a test method for a ferroelectric memory of Example 9. Word lines WL0-WL3 are maintained High, same as in the standby mode. A first reset line RST0 and a second reset line RST1 are driven Low. A first block select line BS0 and a second block select line BS1 are driven High. A plate line PL is held at a stress potential. A first bit line/BL and a second bit line BL are held at a GND level.

As a result, a stress voltage Vst is applied to all ferroelectric capacitors C0-C7. In the stress test, an electric field is applied to the ferroelectric capacitors C0-C7 in the direction from the plate line PL to cell nodes SN0-SN7.

By setting the above stress test conditions to give a predetermined potential to each of the bit line and the plate line, and conducting a test such as a burn-in test at high temperature, it is possible to simultaneously conduct a stress test on all ferroelectric capacitors C0-C7.

EXAMPLE 10

Example 10 shows a test method for a ferroelectric memory for conducting a stress test related to a fatigue test that repeats polarization inversion of a ferroelectric capacitor of a memory cell. The circuit configuration of a ferroelectric memory used in the test method for a ferroelectric memory and the operations in the standby mode and active mode according to Example 10 are similar to those in Example 8.

Figure 13:
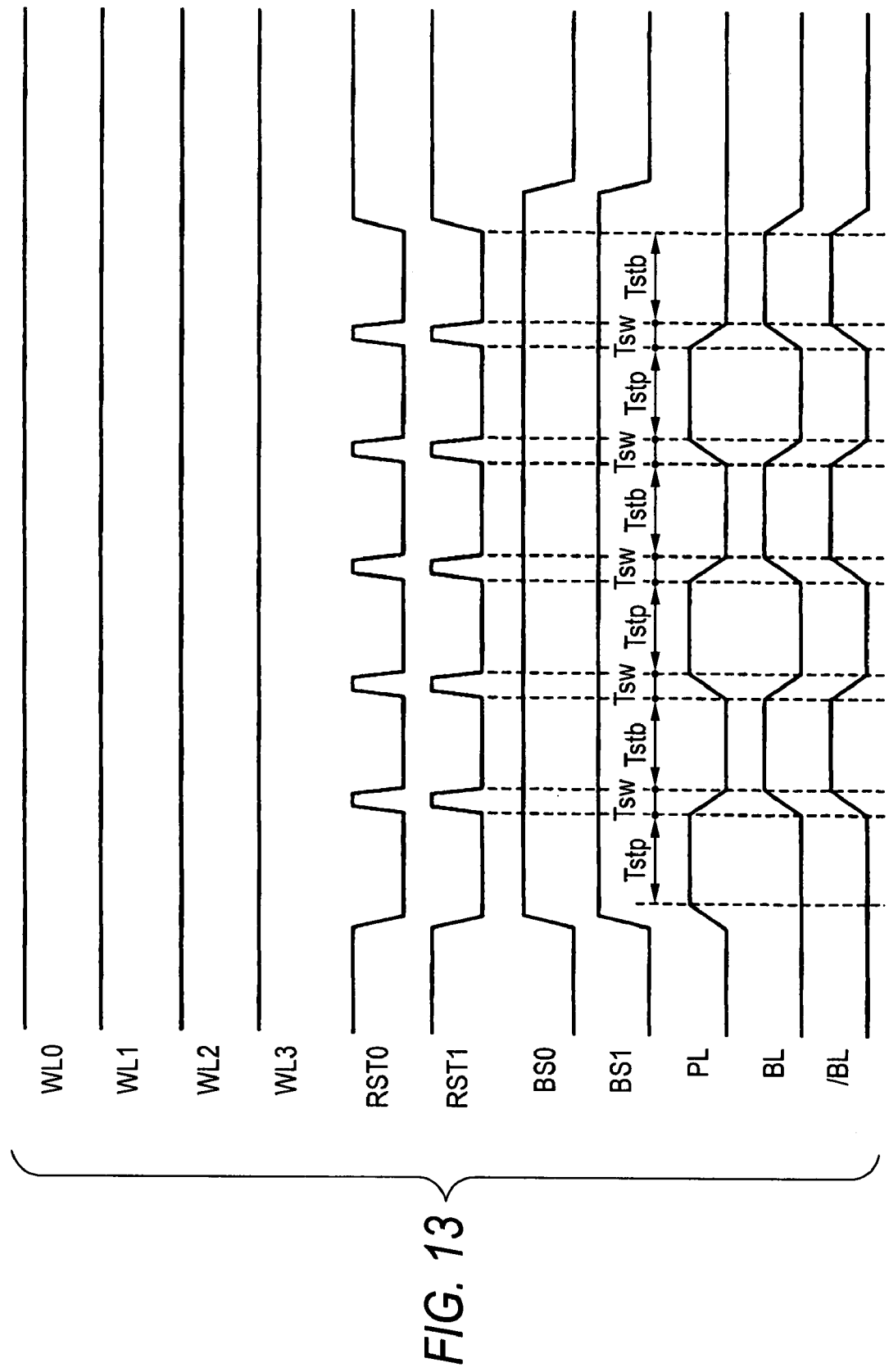
FIG. 13 shows an operation waveform observed during a stress test in accordance with a test method for a ferroelectric memory of Example 10.

FIG. 13 shows an operation waveform observed during a stress test in accordance with a test method for a ferroelectric memory of Example 10. Word lines WL0-WL3 are maintained High, same as in the standby mode. A first reset line RST0 and a second reset line RST 1 are driven low in a period Tstp and a period Tstb. In the period Tstp, a stress potential is applied to a plate line PL. In the period Tstb, a stress potential is applied to a first bit line/BL and a second bit line BL. The first reset line RST 0 and the second reset line RST 1 are driven High in a period Tsw where a polarity of a stress voltage Vst is switched. A first block select line BS0 and a second block select line BS1 are driven High. A high level potential and a low level potential are alternately applied to a plate line PL and the first and second bit lines/BL, BL in a predetermined cycle.

In the period Tstp and the period Tstb shown in FIG. 13, a stress voltage is applied to the ferroelectric capacitors C0-C7, and the first reset line RST0 and the second reset line RST1 are driven Low. In the period Tsw, the stress voltage is inverted, and the first reset line RST0 and the second reset line RST1 are driven High. In the period Tstp, the plate line PL is held at the stress voltage Vst, and the first bit line/BL and the second bit line BL are held at a GND level. In the period Tstb, the plate line PL is held at a GND level, and the first bit line/BL and the second bit line BL are held at a stress potential.

In the period Tstp, an electric field is applied to the ferroelectric capacitors C0-C7 in the direction from the plate line PL to cell nodes SN0-SN7. In the period Tstb, an electric field is applied to the ferroelectric capacitors C0-C7 in the direction from the cell nodes SN0-SN7 to the plate line PL. In the period Tsw, the first reset line RST0 and the second reset line RST1 are driven High, and the plate line PL, the first local bit line/LBL and the second local bit line LBL are short-circuited, and the cell transistors Q0-Q7 are ON, so that the cell nodes SN0-SN7 and the plate line PL are short-circuited.

When transition is made from the period Tstp to the period Tsw, the potential of the plate line PL is discharged not only fom a plate driving circuit PLD but also from a bit line driving circuit SA via a first reset transistor QR0 and a second reset transistor QR1, a first local bit line/LBL and a second local bit line LBL, a first block select transistor QS0 and a second block select transistor QS1 as well as a first bit line/BL and a second bit line BL.

When transition is made from the period Tstb to the period Tsw, the potential of the cell nodes SN0-SN7 is discharged not only by a bit line driving circuit SA via cell transistors Q0-Q7, a first local bit line/LBL and a second local bit line LBL, and a first bit line/BL and a second bit line BL, but also from a plate driving circuit PLD from the first local bit line/LBL and the second local bit line LBL via a first reset transistor QR0 and a second reset transistor QR1.

Thus, when the polarity of a voltage is switched, high-speed discharge is enabled so that it is possible to conduct a fatigue test of high-speed voltage switching on the ferroelectric capacitors C0-C7. In the test method for a ferroelectric memory according to Example 10, the detailed waveform of a voltage applied to the ferroelectric memories C0-C7 is similar to the waveform shown in FIGS. 5A and 5B.

By setting the above stress test conditions to give a predetermined potential to each of the bit line and the plate line, and conducting a test such as a burn-in test at high temperature, it is possible to simultaneously conduct a stress test on all ferroelectric capacitors C0-C7.

EXAMPLE 11

Example 11 shows a test method for a ferroelectric memory for conducting a stress test by applying a predetermined voltage to cell transistors Q0-Q7 of a memory cell. The circuit configuration of a ferroelectric memory used in the test method for a ferroelectric memory and the operations in the standby mode and active mode according to Example 11 are similar to those in Example 8.

Figure 14:
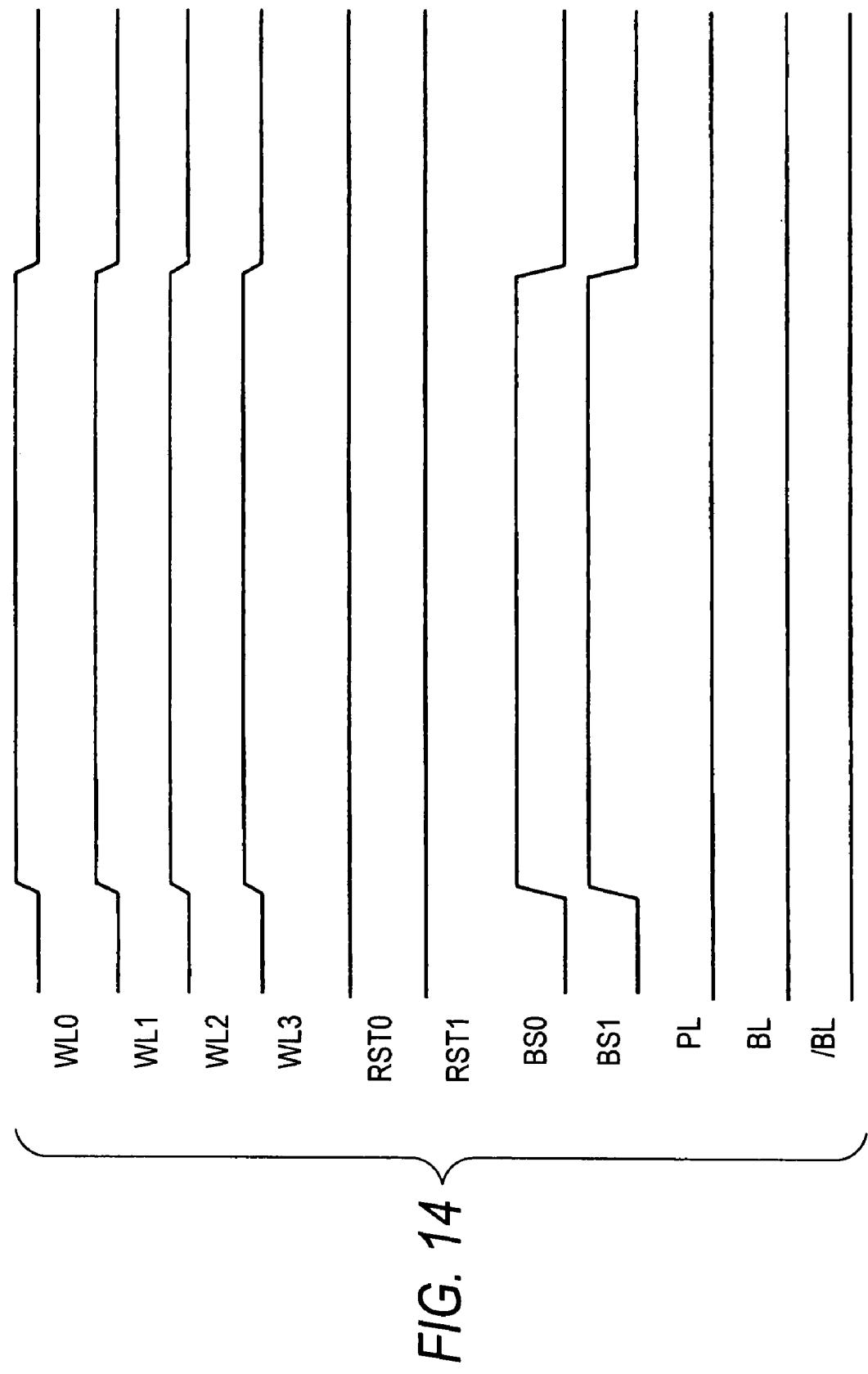
FIG. 14 shows an operation waveform observed during a stress test in accordance with a test method for a ferroelectric memory of Example 11.

FIG. 14 shows an operation waveform observed during a stress test in accordance with a test method for a ferroelectric memory of Example 11. A voltage higher than that used in the standby mode by a predetermined voltage is applied to word lines WL0-WL3. A first reset line RST0 and a second reset line RST1 are driven High. A first block select line BS0 and a second block select line BS1 are driven High, and a plate line PL and a first bit line/BL and a second bit line BL are held at a GND level.

As a result, a stress voltage Vst is applied to all cell transistors Q0-Q7. In the stress test, a stress voltage is applied to the channel region between the source and the drain from the gate of each of the cell transistors Q0-Q7.

By setting the above stress test conditions and conducting a test such as a burn-in test at high temperature, it is possible to simultaneously conduct a stress test on all cell transistors Q0-Q7.

EXAMPLE 12

Example 12 shows a test method for a ferroelectric memory for conducting a stress test by applying a predetermined voltage to a first reset transistor QR0 and a second reset transistor QR1. The circuit configuration of a ferroelectric memory used in the test method for a ferroelectric memory and the operations in the standby mode and active mode according to Example 12 are similar to those in Example 8.

Figure 15:
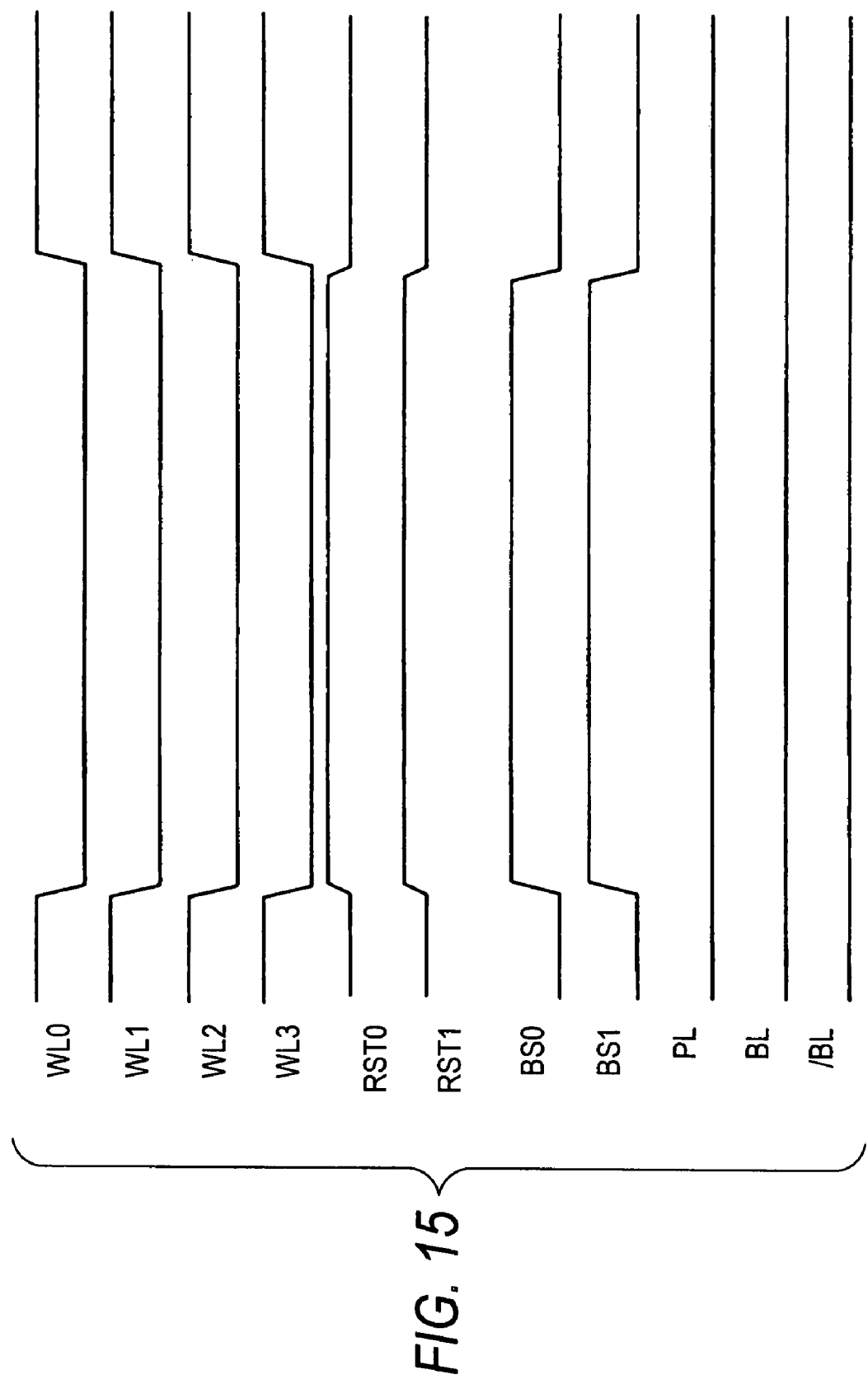
FIG. 15 shows an operation waveform observed during a stress test in accordance with a test method for a ferroelectric memory of Example 12.

FIG. 15 shows an operation waveform observed during a stress test in accordance with a test method for a ferroelectric memory of Example 12. Word lines WL0-WL3 are driven Low. A voltage higher than that used in the standby mode by a predetermined voltage is applied to a first reset line RST0 and a second reset line RST1. A first block select line BS0 and a second block select line BS1 are driven High and a plate line PL and a first bit line/BL and a second bit line BL are held at a GND level.

As a result, a stress voltage Vst is applied to a first reset transistor QR0 and a second reset transistor QR1. In the stress test, a stress voltage is applied to the channel region between the source and the drain from the gate of each of the first reset transistor QR0 and the second reset transistor QR1.

By setting the above stress test conditions and conducting a test such as a burn-in test at high temperature, it is possible to simultaneously conduct a stress test on the first reset transistor QR0 and the second reset transistor QR1.

EXAMPLE 13

Example 13 shows a test method for a ferroelectric memory for conducting a stress test by applying a predetermined voltage to a first block select transistor QS0 and a second block select transistor QS1. The circuit configuration of a ferroelectric memory used in the test method for a ferroelectric memory and the operations in the standby mode and active mode according to Example 13 are similar to those in Example 8.

Figure 16:
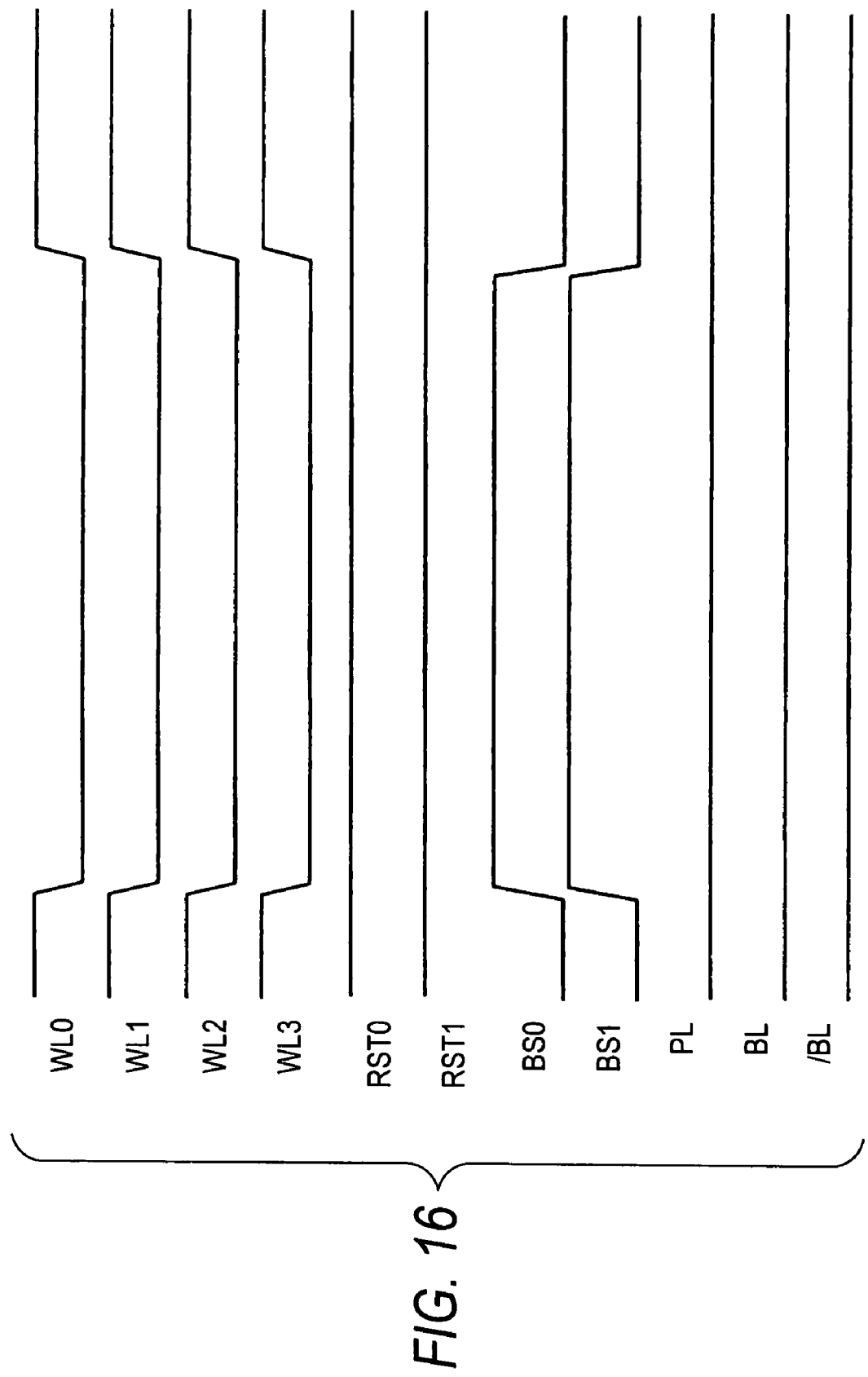
FIG. 16 shows an operation waveform observed during a stress test in accordance with a test method for a ferroelectric memory of Example 13.

FIG. 16 shows an operation waveform observed during a stress test in accordance with a test method for a ferroelectric memory of Example 13. Word lines WL0-WL3 are driven Low. A high level voltage is applied to a first reset line RST0 and a second reset line RST1. A first block select line BS0 and a second block select line BS1 are held at a stress voltage. A plate line PL and a first bit line/BL and a second bit line BL are held at a GND level.

As a result, a stress voltage is applied to a first block select transistor QS0 and a second block select transistor QS1. In the stress test, a stress voltage is applied to the channel region between the source and the drain from each of the gates of the first block select transistor QS0 and the second block select transistor QS1.

By setting the above stress test conditions and conducting a test such as a burn-in test at high temperature, it is possible to simultaneously conduct a stress test on the first block select transistor QS0 and the second block select transistor QS1.

EXAMPLE 14

Example 14 shows a test method for a ferroelectric memory for conducting a stress test by applying a predetermined voltage to cell transistors Q0-Q7, a first reset transistor QR0 and a second reset transistor QR1 as well as a first block select transistor QS0 and a second block select transistor QS1. The circuit configuration of a ferroelectric memory used in the test method for a ferroelectric memory and the operations in the standby mode and active mode according to Example 14 are similar to those in Example 8.

Figure 17:
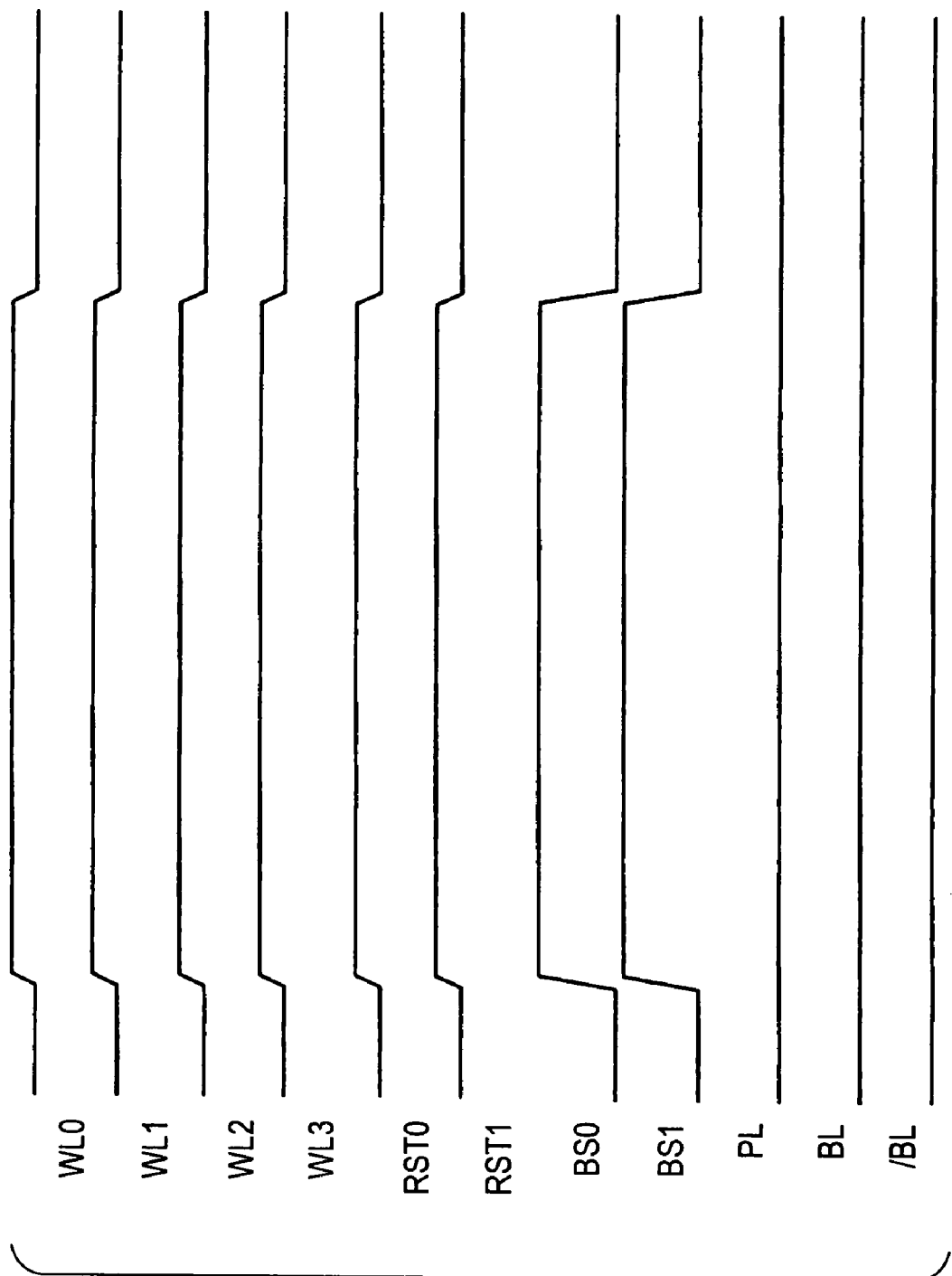
FIG. 17 shows an operation waveform observed during a stress test in accordance with a test method for a ferroelectric memory of Example 14.

FIG. 17 shows an operation waveform observed during a stress test in accordance with a test method for a ferroelectric memory of Example 14. A voltage higher than that used in the standby mode by a predetermined voltage is applied to word lines WL0-WL3. A voltage higher than that used in the standby mode by a predetermined voltage is applied to a first reset line RST0 and a second reset line RST1. A first block select line BS0 and the second block select line BS1 are driven by the voltage higher than the voltage used in the active mode. A plate line PL and a first bit line/BL and a second bit line BL are held at a GND level.

As a result, a stress voltage Vst is applied to all cell transistors Q0-Q7, a first reset transistor QS0 and a second reset transistor QS0, and a first block select transistor QS0 and a second block select transistor QS1. In the stress test, a stress voltage is applied to the channel region between the source and the drain from the gate of each transistor.

By setting the above stress test conditions and conducting a test such as a burn-in test at high temperature, it is possible to simultaneously conduct a stress test on all cell transistors Q0-07, a first reset transistor QS0 and a second reset transistor QS1, and a first block select transistor QS0 and a second block select transistor QS1.

The examples are applicable to a test method for a ferroelectric memory that needs to conduct a stress test for example in a burn-in test.

What is claimed is:

1. A test method for a ferroelectric memory including a cell block that includes: a block select transistor arranged between a bit line and a local bit line, which is turned on/off depending on a potential of a block select line; memory cells arranged between the local bit line and a plate line, each of the memory cells contains a cell transistor and a ferroelectric capacitor connected in series, and the cell transistor turned on/off depending on a potential of word lines; and a reset transistor arranged between the local bit line and the plate line, which is turned on/off depending on a potential of a reset line, the method comprising:
   applying a potential that allows the cell transistors to be ON to the word lines;
   applying a potential that allows the reset transistor to be OFF to the reset line;
   applying a potential that allows the block select transistor to be ON to the block select line; and
   applying a stress voltage between the bit line and the plate line.

2. The method according to claim 1, wherein said applying the stress voltage comprising:
   applying a first potential to the bit line; and
   applying a second potential to the plate line,
   wherein the first potential is higher than the second potential by the stress voltage, thereby applying the stress voltage to the ferroelectric capacitors.

3. The method according to claim 1, wherein said applying the stress voltage comprising:
   applying a second potential to the bit line; and
   applying a first potential to the plate line,
   wherein the first potential is higher than the second potential by the stress voltage, thereby applying the stress voltage to the ferroelectric capacitors.

4. The method according to claim 1, wherein said applying the stress voltage comprising:
   alternately applying a high level potential and a low level potential to the bit line; and
   alternately applying a potential at the opposite level to the potential supplied to the bit line to the plate line, thereby applying the stress voltage to the ferroelectric capacitors.

5. The method according to claim 4, wherein said applying the stress voltage further comprising applying a potential that allows the reset transistor to be ON to the reset line, in a period for changing a polarity of the stress voltage applied to the ferroelectric capacitors.

6. A test method for a ferroelectric memory including a cell block that includes: a block select transistor arranged between a bit line and a local bit line, which is turned on/off depending on a potential of a block select line; memory cells arranged between the local bit line and a plate line, each of the memory cells contains a cell transistor and a ferroelectric capacitor connected in series, and the cell transistor turned on/off depending on a potential of word lines; and a reset transistor arranged between the local bit line and the plate line, which is turned on/off depending on a potential of a reset line, the method comprising:

applying a stress voltage to at least one of: the cell transistors; the reset transistor; and the block select transistor.

7. The method according to claim 6, wherein said applying the stress voltage includes:

applying a potential higher than a potential that allows the cell transistors to be ON to the word lines;

applying a potential that allows the reset transistor to be ON to the reset line;

applying a potential that allows the block select transistor to be ON to the block select line; and applying a ground potential to the bit line and the plate line, whereby the stress voltage is applied to the cell transistors.

8. The method according to claim 6, wherein said applying the stress voltage includes:

applying a potential that allows the cell transistors to be OFF to the word lines;

applying a potential higher than a potential that allows the reset transistor to be ON to the reset line;

applying a potential that allows the block select transistor to be ON to the block select line; and applying a ground potential to the bit line and the plate line, whereby the stress voltage is applied to the reset transistor.

9. The method according to claim 6, wherein said applying the stress voltage includes:

applying a potential that allows the cell transistors to be OFF to the word lines;

applying a potential that allows the reset transistors to be ON to the reset line;

applying a potential that allows stress voltage to be applied to the block select transistor to the block select line; and applying a ground potential to the bit line and the plate line, whereby the stress voltage is applied to the block select transistor.

10. The method according to claim 6, wherein said applying the stress voltage includes:

applying a potential higher than a potential that allows the cell transistors to be ON to the word lines;

applying a potential higher than a potential that allows the reset transistors to be ON to the reset line;

applying a potential that allows stress voltage to be applied to the block select transistor to the block select line; and applying a ground potential to the bit line and the plate line, whereby the stress voltage is applied to the cell transistors, the reset transistor and the block select transistor.

11. A test method for a ferroelectric memory including a first and second cell blocks, first and second reset lines respectively connected to the first and second cell blocks, first and second block select lines respectively connected to the first and second cell blocks, word lines respectively connected to memory cells contained in the first and second cell blocks, first and second bit lines respectively connected to the first and second cell blocks, and a plate line connected to the first and second cell blocks, wherein each of the first and second cell blocks contains: a block select transistor arranged between the connected bit line and a local bit line, which is turned on/off depending on a potential of the connected block select line; the memory cells arranged between the local bit line and the plate line, each of the memory cells contains a cell transistor and a ferroelectric capacitor connected in series, and the cell transistor turned on/off depending on a potential of the connected word line; and a reset transistor arranged between the local bit line and the plate line, which is turned on/off depending on a potential of the connected reset line, the method comprising:

applying a potential that allows the cell transistors to be ON to the word lines;

applying a potential that allows the reset transistors to be OFF to the first and second reset lines;

applying a potential that allows the block select transistors to be ON to the first and second block select lines; and applying a stress voltage between the first and second bit lines and the plate line.

12. The method according to claim 11, wherein said applying the stress voltage comprising;

applying a first potential to the first and second bit lines; and applying a second potential to the plate line, wherein the first potential is higher than the second potential by the stress voltage, thereby applying the stress voltage to the ferroelectric capacitors.

13. The method according to claim 11, wherein said applying the stress voltage comprising:

applying a second potential to the first and second bit lines; and applying a first potential to the plate line, wherein the first potential is higher than the second potential by the stress voltage, thereby applying the stress voltage to the ferroelectric capacitors.

14. The method according to claim 11, wherein said applying the stress voltage comprising:

alternately applying a high level potential and a low level potential to the first and second bit lines; and alternately applying a potential at the opposite level to the potential applied to the first and second bit lines to the plate line, thereby applying the stress voltage to the ferroelectric capacitors.

15. The method according to claim 14, wherein said applying the stress voltage further comprising applying a potential that allows the reset transistors to be ON to the first and second reset lines, in a period for changing a polarity of the stress voltage applied to the ferroelectric capacitors.

16. A test method for a ferroelectric memory including a first and second cell blocks, first and second reset lines respectively connected to the first and second cell blocks, first and second block select lines respectively connected to the first and second cell blocks, word lines respectively connected to memory cells contained in the first and second cell blocks, first and second bit lines respectively connected to the first and second cell blocks, and a plate line connected to the first and second cell blocks, wherein each of the first and second cell blocks contains; a block select transistor arranged between the connected bit line and a local bit line, which is turned on/off depending on a potential of the connected block select line; the memory cells arranged between the local bit line and the plate line, each of the memory cells contains a cell transistor and a ferroelectric capacitor connected in series, and the cell transistor turned on/off depending on a potential of the connected word line; and a reset transistor arranged between the local bit line and the plate line, which is turned on/off depending on a potential of the connected reset line, the method comprising:

applying the stress voltage to at least one of; the cell transistors; the reset transistors; and the block select transistors.

17. The method according to claim 16, wherein said applying the stress voltage includes:

applying a potential higher than a potential that allows the cell transistors to be ON to the word lines;

applying a potential that allows the reset transistors to be ON to the first and second reset lines;

applying a potential that allows the block select transistors to be ON to the first and second block select lines; and applying a ground potential to the first and second bit lines and the plate line, whereby the stress voltage is applied to the cell transistors.

18. The method according to claim 16, wherein said applying the stress voltage includes:

applying a potential that allows the cell transistors to be OFF to the word lines;

applying a potential higher than a potential that allows the reset transistors to be ON to the first and second reset lines;

applying a potential that allows the block select transistors to be ON to the first and second block select lines; and applying a ground potential to the first and second bit lines and the plate line, whereby the stress voltage is applied to the reset transistors.

19. The method according to claim 16, wherein said applying the stress voltage includes:

applying a potential that allows the cell transistors to be OFF to the word lines;

applying a potential that allows the reset transistors to be ON to the first and second reset lines;

applying a potential that allows stress voltage to be applied to the block select transistors to the first and second block select lines; and applying a ground potential to the first and second bit lines and the plate line, whereby the stress voltage is applied to the block select transistors.

20. The method according to claim 16, wherein said applying the stress voltage includes:

applying a potential higher than a potential that allows the cell transistors to be ON to the word lines;

applying a potential higher than a potential that allows the reset transistors to be ON to the first and second reset lines;

applying a potential that allows stress voltage to be applied to the block select transistors to the first and second block select lines; and applying a ground potential to the first and second bit lines and the plate line, whereby the stress voltage is applied to the cell transistors, reset transistors and the block select transistors.

* * * * *